US012431451B2

(12) United States Patent
    Okada

(10) Patent No.: US 12,431,451 B2
(45) Date of Patent: Sep. 30, 2025

(54) SEMICONDUCTOR DEVICE

(71) Applicant: Kioxia Corporation, Tokyo (JP)

(72) Inventor: Nobuaki Okada, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 603 days.

(21) Appl. No.: 17/930,149

(22) Filed: Sep. 7, 2022

(65) Prior Publication Data
    US 2023/0307397 A1    Sep. 28, 2023

(30) Foreign Application Priority Data
    Mar. 23, 2022    (JP) ................. 2022-046644

(51) Int. Cl.
    *H01L 23/00*      (2006.01)
    *H01L 25/065*     (2023.01)
    *H01L 25/18*      (2023.01)

(52) U.S. Cl.
    CPC .......... *H01L 24/08* (2013.01); *H01L 25/0657* (2013.01); *H01L 25/18* (2013.01); *H01L 2224/08146* (2013.01); *H01L 2924/1431* (2013.01); *H01L 2924/1436* (2013.01); *H01L 2924/14511* (2013.01)

(58) Field of Classification Search
    None
    See application file for complete search history.

(56) References Cited

U.S. PATENT DOCUMENTS

| 8,957,358 | B2 * | 2/2015 | Wan ................. H10F 39/018 |
| | | | 257/686 |
| 9,728,521 | B2 * | 8/2017 | Tsai ................. H01L 24/08 |
| 10,090,315 | B2 | 10/2018 | Fukuzumi et al. |
| 10,651,153 | B2 | 5/2020 | Fastow et al. |
| 2018/0277497 | A1 * | 9/2018 | Matsuo ............... H10D 88/00 |
| 2019/0043868 | A1 | 2/2019 | Hasnat et al. |
| 2021/0082880 | A1 | 3/2021 | Sanuki et al. |
| 2021/0082897 | A1 | 3/2021 | Okada et al. |
| 2021/0082900 | A1 | 3/2021 | Tanioka |
| 2021/0118862 | A1 | 4/2021 | Maejima et al. |

FOREIGN PATENT DOCUMENTS

| JP | 2016-62901 A | 4/2016 |
| JP | 2021-64731 A | 4/2021 |

* cited by examiner

*Primary Examiner* — Hung K Vu
(74) *Attorney, Agent, or Firm* — Oblon, McClelland, Maier &Neustadt, L.L.P.

(57) ABSTRACT

According to one embodiment, a device includes a first chip including a first via in a first surface; and a second chip including a second via in a second surface and overlapping the first chip in a direction perpendicular to the first surface. The first via includes a first side along a second direction parallel to the first surface, and a second side along a third direction parallel to the first surface, the second via includes a third side along the third direction and a fourth side along the second direction, a dimension of the first side is larger than a dimension of the second side, a dimension of the third side is larger than a dimension of the fourth side. The first via is in contact with the second via so that the first side intersects the third side.

20 Claims, 22 Drawing Sheets

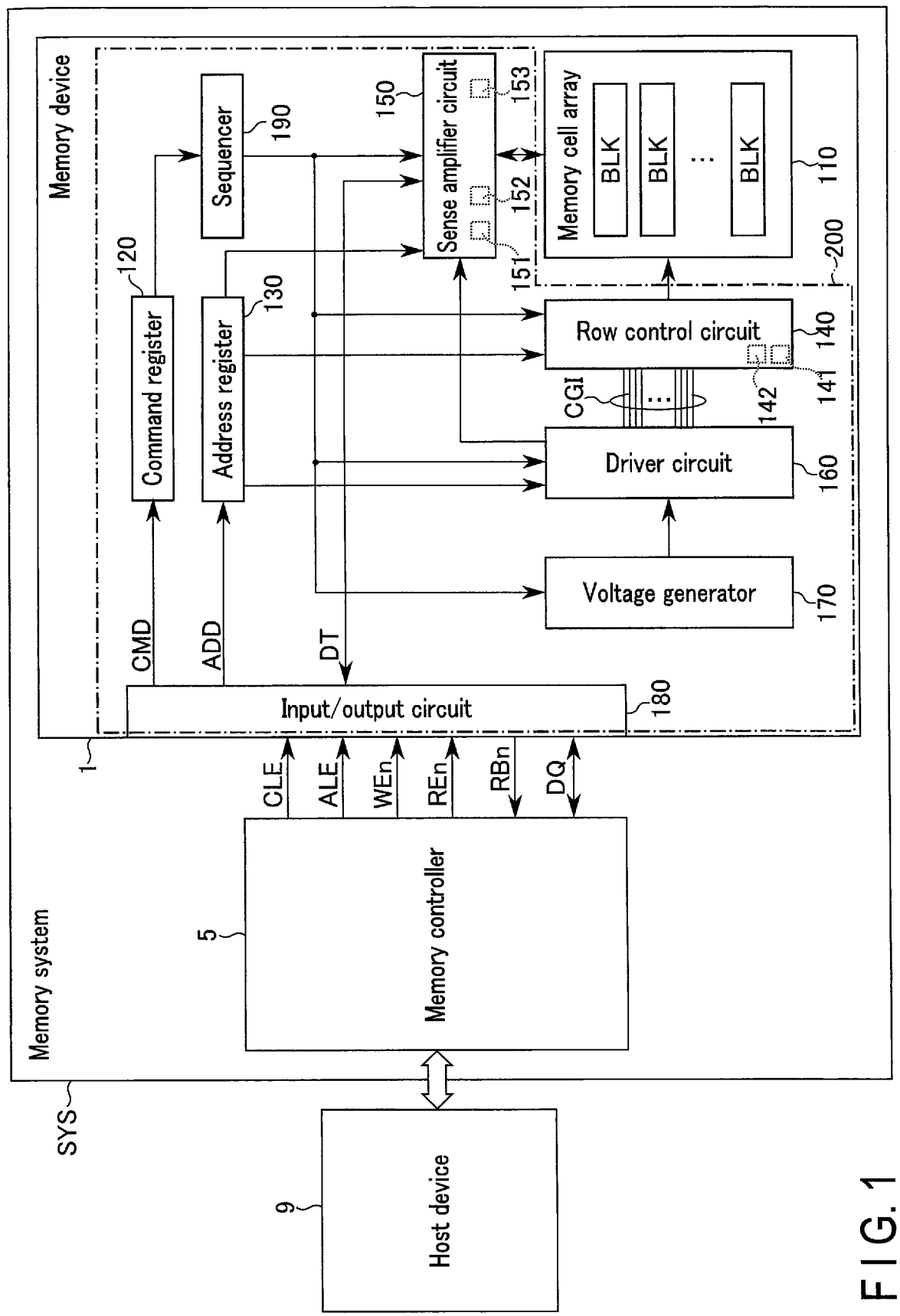
F I G. 1

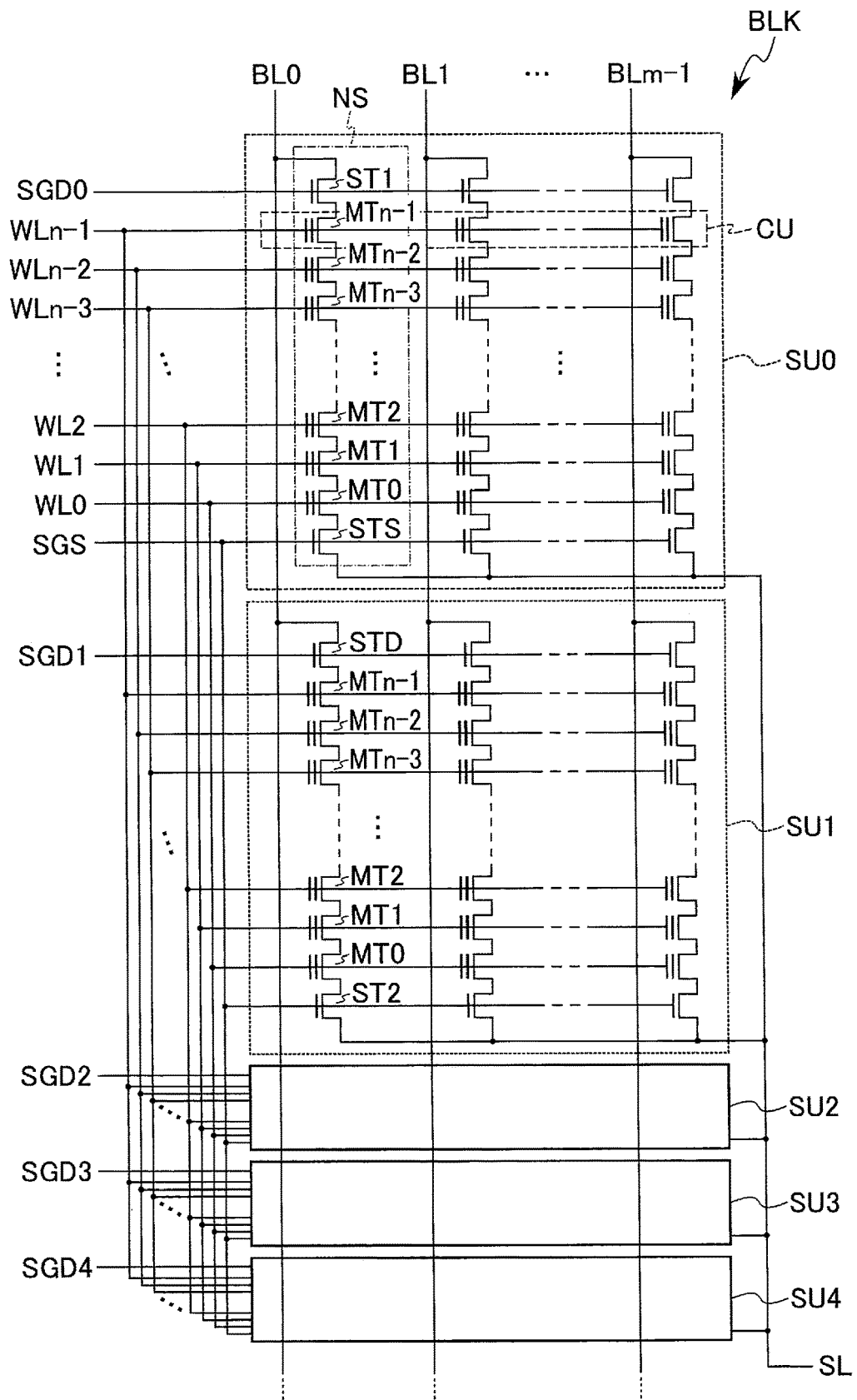
F I G. 2

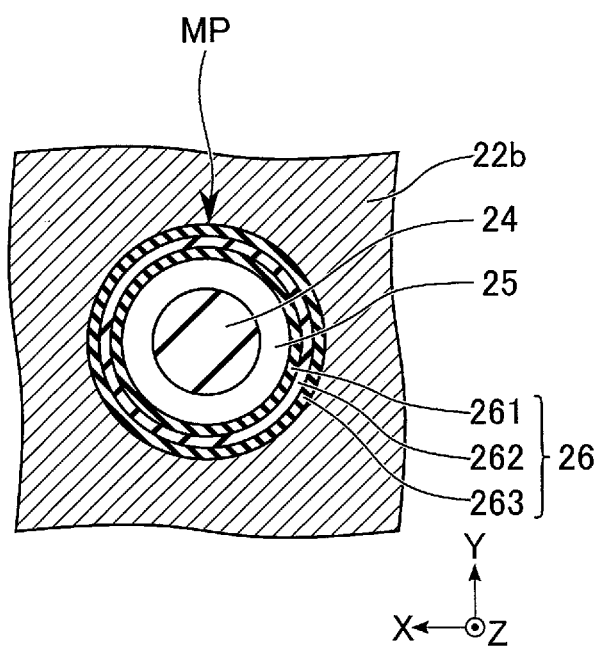
F I G. 5

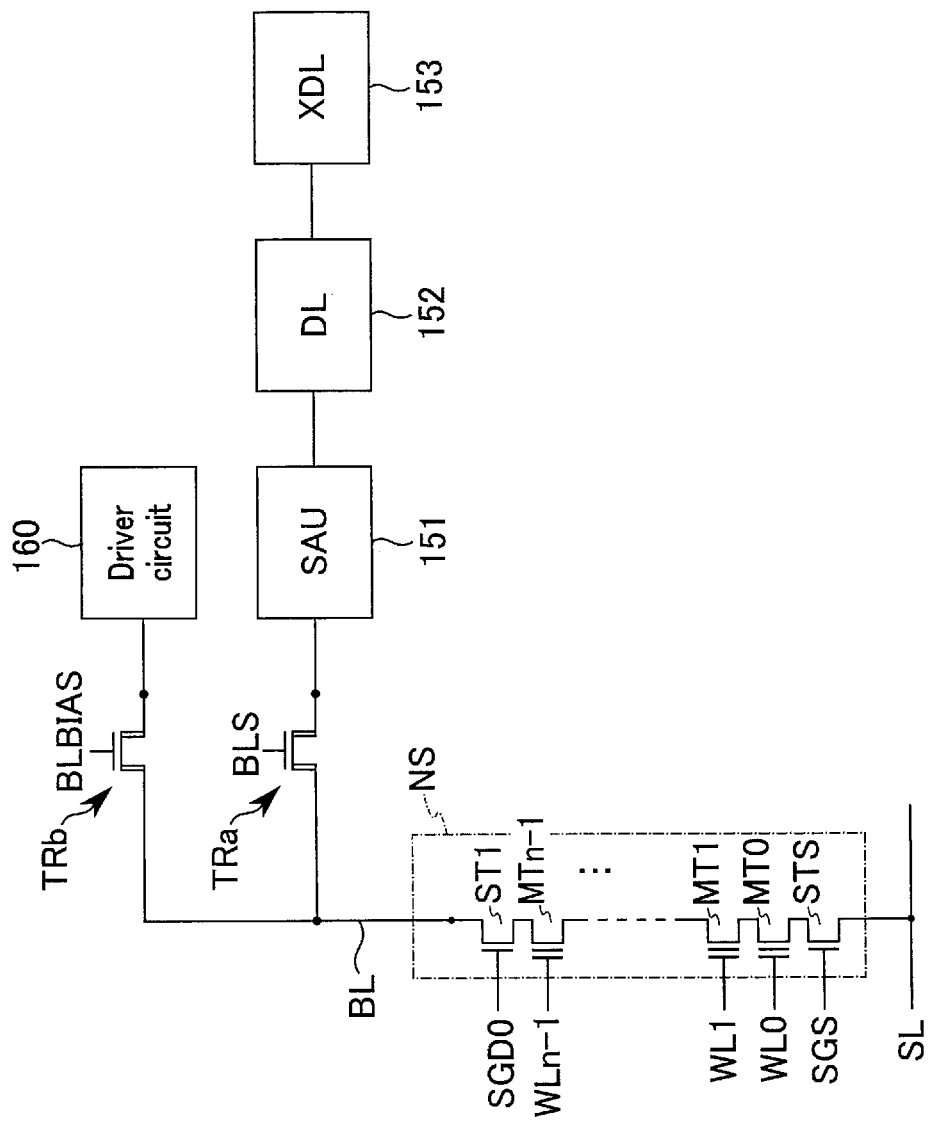
F I G. 15

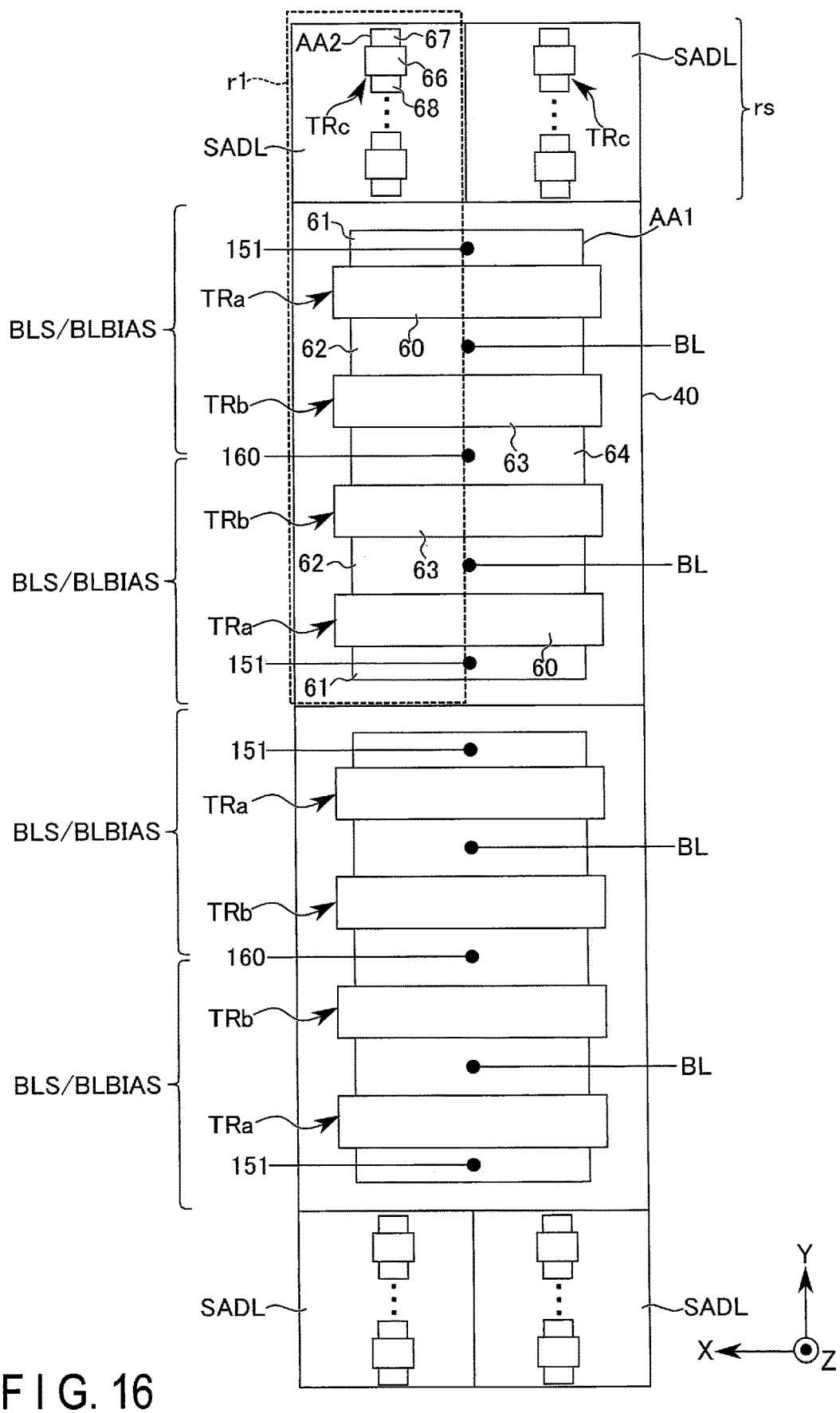
F I G. 16

SEMICONDUCTOR DEVICE

CROSS-REFERENCE TO RELATED APPLICATIONS

This application is based upon and claims the benefit of priority from Japanese Patent Application No. 2022-046644, filed Mar. 23, 2022, the entire contents of which are incorporated herein by reference.

FIELD

Embodiments described herein relate generally to a semiconductor device.

BACKGROUND

A semiconductor device having a structure in which a plurality of semiconductor chips are bonded is known.

BRIEF DESCRIPTION OF THE DRAWINGS

FIG. 1 is a block diagram showing a system including a memory device of a first embodiment.

FIG. 2 is a circuit diagram showing a configuration example of a memory cell array in the memory device of the first embodiment.

FIG. 5 is a top view showing a planar structure of a memory cell of the memory device of the first embodiment.

FIG. 15 is a circuit diagram showing a configuration example of the memory device of the first embodiment.

FIG. 16 is a top view showing an example of a layout of the memory device of the first embodiment.

DETAILED DESCRIPTION

Figure 3:
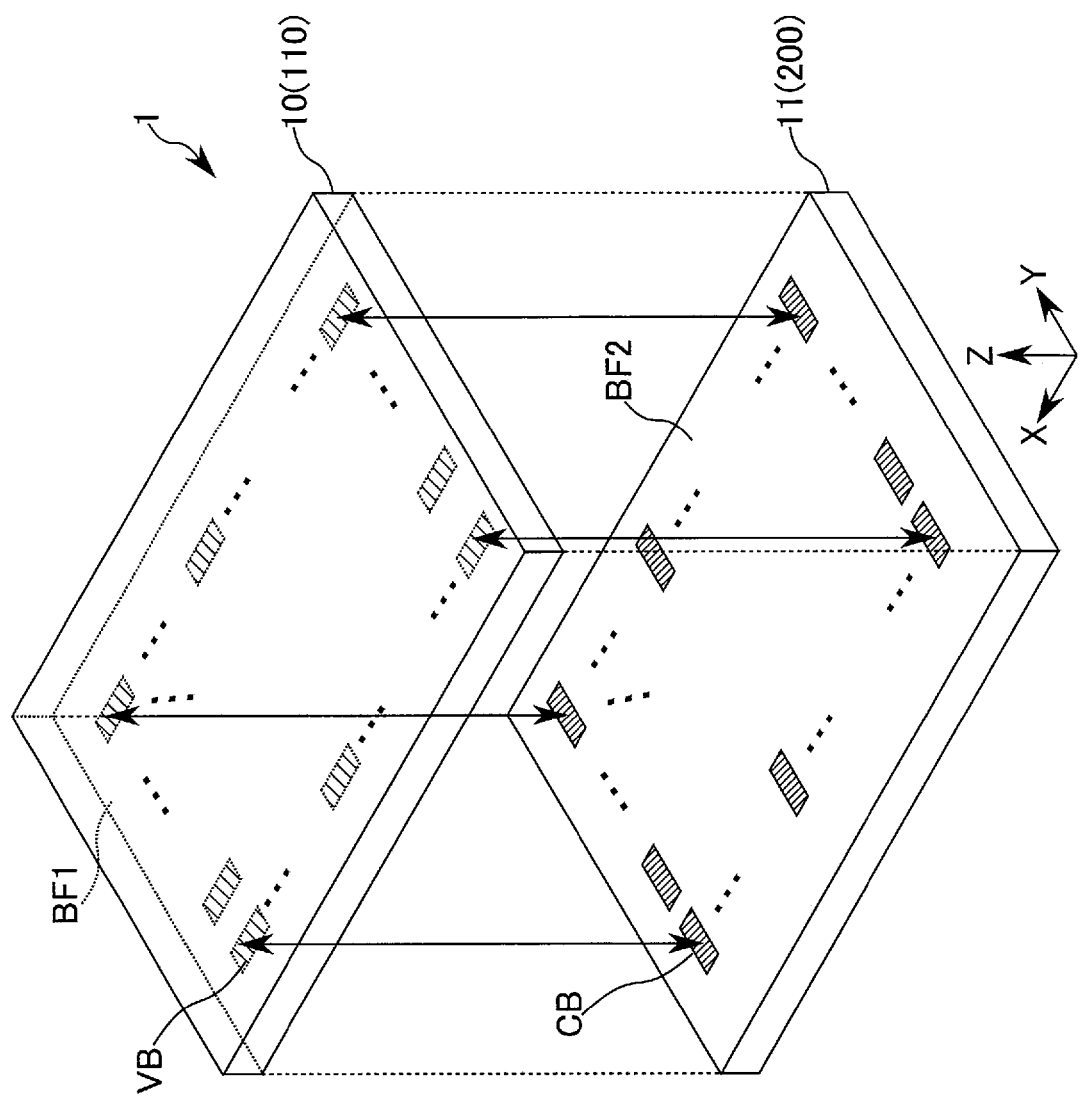
FIG. 3 is a diagram showing an outline of a structure of the memory device of the first embodiment.

A semiconductor device of an embodiment will be described with reference to FIGS. 1 to 22.

Hereinafter, the present embodiment will be described in detail with reference to the drawings. In the following descriptions, components having the same function and configuration will be denoted by the same reference sign.

In the embodiments to be described below, when structural components (e.g., circuits, interconnects, voltages and signals of various types, etc.) assigned with reference symbols accompanied by a numeral/symbol for distinction need not be distinguished from one another, reference symbols are used without the accompanying numeral/symbol.

Embodiment

In general, according to one embodiment, a semiconductor device includes: a first semiconductor chip including an element and a first via provided in a first surface; and a second semiconductor chip including a second via provided in a second surface and a circuit electrically coupled to the element through the first and second vias, and overlapping the first semiconductor chip in a first direction perpendicular to the first and second surfaces, wherein the first via includes a first side along a second direction parallel to the first surface, and a second side along a third direction parallel to the first surface and intersecting the second direction, the second via includes a third side along the third direction and a fourth side along the second direction, a dimension of the first side in the second direction is larger than a dimension of the second side in the third direction, a dimension of the third side in the third direction is larger than a dimension of the fourth side in the second direction, and the first via is in contact with the second via so that the first side intersects the third side.

(1) First Embodiment

A semiconductor device of a first embodiment will be described with reference to FIGS. 1 to 19. The semiconductor device of the first embodiment is a memory device.

(1a) Configuration Example

<Overall Configuration>

An overall configuration of the memory device of the first embodiment will be described with reference to FIGS. 1 to 3.

FIG. 1 is a block diagram for explaining a configuration example of a memory system SYS including a memory device 1 of the present embodiment.

As shown in FIG. 1, the memory system SYS is coupled to a host device 9 via a host bus. The memory system SYS may be requested by the host device 9 to write data, read data, and erase data.

The host device 9 is, for example, a personal computer or a server, etc. The host bus is a bus compatible with an interface standard such as an SD™ interface, a serial attached small computer system interface (SCSI) (SAS), a serial advanced technology attachment (ATA) (SATA), peripheral component interconnect express (PCIe), or a non-volatile memory express (NVMe), for example. The memory system SYS may be coupled to the host device 9 via a wireless communication.

The memory system SYS includes the memory device 1 and a memory controller 5 of the present embodiment.

The memory controller 5 is electrically coupled to the memory device 1. The memory controller 5 transmits a command CMD, address information ADD, and a plurality of control signals to the memory device 1.

The memory device 1 is a non-volatile semiconductor memory device. For example, the memory device 1 of the present embodiment is a NAND flash memory 1.

The memory device 1 receives the command CMD, address information ADD, and control signals. Data DT is transferred between the memory device 1 and the memory controller 5. Hereinafter, data DT transferred from the memory controller 5 to the memory device 1 in a write sequence will be referred to as write data. The write data DT is written in the memory device 1. Data DT transferred from the memory device 1 to the memory controller 5 in a read sequence will be referred to as read data. The read data DT is read from the memory device 1.

The memory device 1 includes, for example, a memory cell array 110, a command register 120, an address register 130, a row control circuit 140, a sense amplifier circuit 150, a driver circuit 160, a voltage generator 170, an input/output circuit 180, and a sequencer 190.

The memory cell array 110 stores data. A plurality of bit lines and a plurality of word lines are provided in the memory cell array 110. The memory cell array 110 includes a plurality of blocks BLK. Each block BLK is a set of a plurality of memory cells. Each memory cell is associated with one bit line and one word line. The memory cell array 110 includes a plurality of select gate lines for selecting control units within the memory cell array 110.

An internal configuration of the memory cell array 110 will be described later.

The command register 120 temporarily stores the command CMD received from the memory controller 5. The command CMD is, for example, a signal including an order to cause the sequencer 190 to execute a read sequence, a write sequence, an erase sequence, etc.

The address register 130 temporarily stores the address information (selected address) ADD received from the memory controller 5. The address information ADD includes, for example, a block address, a page address (word line address), a column address, etc. For example, the block address, the page address, and the column address are used to select a block BLK, a word line, and a bit line (column), respectively. Hereinafter, a block selected based on a block address will be referred to as a selected block. A word line selected based on a page address will be referred to as a selected word line.

The row control circuit 140 controls operations relating to the rows of the memory cell array 110. The row control circuit 140 selects one block BLK in the memory cell array 110, based on a block address. The row control circuit 140, for example, transfers a voltage applied to an interconnect corresponding to a selected word line to the selected word line in the selected block BLK. The row control circuit 140 controls selection and non-selection of a select gate line based on address information ADD. The row control circuit 140 includes a word line switch 141, a block decoder 142, etc. The word line switch 141 controls coupling between a word line and the driver circuit 160 to be described later based on a page address and a block address. The block decoder 142 controls selection and non-selection of a block based on a result of decoding of a block address.

The sense amplifier circuit 150 controls operations relating to the columns of the memory cell array 110. In a write sequence, the sense amplifier circuit 150 applies a voltage to each bit line provided in the memory cell array 110 in accordance with write data DT received from the memory controller 5. In a read sequence, the sense amplifier circuit 150 determines data stored in a memory cell based on a presence/absence of current generation or a fluctuation in electric potential of a bit line. The sense amplifier circuit 150 transfers data based on a result of this determination to the memory controller 5 as read data.

The sense amplifier circuit 150 includes a sense amplifier unit 151, a data latch circuit 152, a cache circuit 153, etc. The sense amplifier unit 151 performs control of an electric potential of a bit line, detection and amplification of a signal of a bit line, etc. The data latch circuit 152 temporarily stores a signal (a signal from a memory cell) detected by the sense amplifier unit 151, a signal corresponding to write data, etc. The cache circuit 153 is a cache memory that temporarily holds data (write data) to be input to the memory cell array 110 and data (read data) output from the memory cell array 110.

The driver circuit 160 outputs a plurality of voltages used in a read sequence, a write sequence, an erase sequence, etc. to the memory cell array 110. The driver circuit 160 applies a predetermined voltage to an interconnect corresponding to a word line, a bit line, etc., based on address information in the address register 130. For example, the driver circuit 160 is coupled to the word line switch 141 of the row control circuit 140 via a plurality of interconnects CGI.

The voltage generator 170 generates a plurality of voltages for various types of operations of the memory device 1. The voltage generator 170 outputs the generated voltages to the driver circuit 160.

The input/output circuit 180 functions as an interface circuit on the memory device 1 side between the memory device 1 and the memory controller 5. When the memory device 1 is a NAND flash memory, the input/output circuit 180 communicates with the memory controller 5 based on a NAND interface standard such as an open. NAND flash interface (ONFi). A command latch enable signal CLE, an address latch enable signal ALE, a write enable signal WEn, a read enable signal REn, a ready/busy signal RBn, and an input/output signal DQ, etc. are used for communications between the memory device 1 and the memory controller 5.

The command latch enable signal CLE is a signal indicating that an input/output signal DQ received by the memory device 1 is a command CMD. The address latch enable signal. ALE is a signal indicating that a signal DQ received by the memory device 1 is address information ADD. The write enable signal WEn is a signal instructing the memory device 1 to input therein an input/output signal DQ. The read enable signal REn is a signal instructing the memory device 1 to output therefrom an input/output signal DQ.

The ready/busy signal RBn is a signal from the memory device 1 notifying the memory controller 5 of whether the memory device 1 is in a ready state in which the memory device 1 accepts an order from the memory controller 5 or in a busy state in which the memory device 1 does not accept the order.

The input/output signal DQ is, for example, an 8-bit width signal set. The input/output signal DQ may include a command CMD, address information ADD, data DT, etc.

The sequencer 190 controls the operations of the entire memory device 1. For example, the sequencer 190 controls each circuit based on a command CMD in the command register 120.

Hereinafter, each or a set of the circuits 120 to 190 except for the memory cell array 110 in the memory device 1 will be referred to as a CMOS circuit 200. Of the CMOS circuit 200, a set of the row control circuit 140 and the sense amplifier circuit 150 will be referred to as a core circuit. Of the CMOS circuit 200, a set of a plurality of circuits other than the core circuit will be referred to as a peripheral circuit.

FIG. 2 is a circuit diagram showing a circuit configuration of one block BLK in the memory cell array 110.

As shown in FIG. 2, one block BLK includes a plurality of (e.g., five) string units SU (SU0 to SU4). Each string unit SU includes a plurality of NAND strings NS. The number of blocks in the memory cell array 110, the number of string units in each block BLK, and the number of NAND strings in each string unit SU may be any number.

Each NAND string NS includes a plurality of memory cells MT (MT0 to MTn-1) and a plurality of select transistors STD and STS. The symbol n is a natural number of 2 or more. The memory cells MT are coupled in series between the source of the select transistor STD and the drain of the select transistor STS.

The memory cell MT stores data in a substantively non-volatile manner.

The memory cell (hereinafter also referred to as a "memory cell transistor") MT is a field-effect transistor including a control gate and a charge storage layer.

The gates of the select transistors STD in the string units SU0 to SU4 are coupled to corresponding select gate line SGD of the select gate lines SGD (SGD0 to SGD4), respectively.

The gates of the select transistors STS in the string units SU0 to SU4 are, for example, commonly coupled to a select gate line SGS. The gates of the select transistors STS in different string units SU0 to SU4 may be coupled to respectively different select gate lines SGS.

The control gates of the memory cells MT0 to MTn-1 belonging to the same block BLK are coupled to respectively corresponding word lines WL of a plurality of word lines WL (WL0 to WLn-1).

The drains of select transistors STD of the NAND strings NS belonging to the same column in the memory cell array 110 are each coupled to one corresponding bit line BL of a plurality of bit lines BL (BL0 to BL(m-1)). The symbol m is a natural number of 2 or more.

The sources of a plurality of select transistors STS are coupled in common to a source line SL.

The string unit SU is an assembly of NAND strings NS coupled to different bit lines BL and coupled to the same select gate line SGD.

The block BLK is an assembly of a plurality of string units SU that share a plurality of word lines WL. The memory cell array 110 is an assembly of a plurality of blocks BLK that share a plurality of bit lines BL.

Hereinafter, a set of memory cells MT (a memory cell group) coupled in common to the same word line WL in each string unit SU will also be referred to as a cell unit CU (or a memory group).

FIG. 3 is a schematic diagram showing an outline of a structure of the memory device 1 of the present embodiment.

The memory device 1 according to the present embodiment includes two semiconductor chips 10 and 11.

One semiconductor chip 10 is provided above the other semiconductor chip 11. The two semiconductor chips 10 and 11 are arranged in the Z direction. The Z direction is a direction perpendicular to a first surface BF1 (and a second surface BF2 of the semiconductor chip 11) of the semiconductor chip 10.

One semiconductor chip 10 is a chip of the memory cell array 110. Hereinafter, the semiconductor chip 10 including the memory cell array 110 will also be referred to as a memory cell array chip 10.

The other semiconductor chip 11 is a chip including the CMOS circuit 200 such as the row control circuit 140, the sense amplifier circuit 150, and the sequencer 190. Hereinafter, the semiconductor chip 11 of the CMOS circuit will be referred to as a CMOS circuit chip 11.

The memory cell array chip 10 is bonded to the CMOS circuit chip 11. The surface BF1 on a side where a bonding member VB of the memory cell array chip 10 is exposed is in contact with the surface BF2 on a side where a bonding member CB of the CMOS circuit chip 11 is exposed. The surface BF1 faces the surface BF2. Thereby, the memory cell array chip 10 is electrically coupled to the CMOS circuit chip 11 via the bonding members VB and CB.

As such, the memory device 1 of the present embodiment includes a bonded structure of a plurality of semiconductor chips 10 and 11.

A plurality of bonding members VB are provided in the surface BF1 of the memory cell array chip 10. A plurality of bonding members CB are provided in the surface BF2 of the CMOS circuit chip 11.

In the memory device 1 having the bonded structure of the present embodiment, a via VB of the memory cell array chip 10 and a via CB of the CMOS circuit chip 11 are used as bonding members for bonding (joining) the two semiconductor chips 10 and 11. The vias VB and CB are each formed of, for example, copper or an alloy including (containing) copper, and a barrier metal. The barrier metal includes (contains) a titanium nitride, a tantalum nitride, or a layer stack of a tantalum nitride and tantalum. In the vias VB and CB, the copper (or a copper alloy) is provided on the barrier metal.

The via VB as a bonding member of the memory cell array chip 10 faces the via CB as a bonding member of the CMOS circuit chip 11 in the Z direction. The via VB is in direct contact with the via CB. The via VB is joined to the via CB by covalent bonding that occurs between members forming the vias VB and CB. The memory cell array chip 10 is thereby bonded to the CMOS circuit chip 11.

In the present embodiment, the vias VB and CB as bonding members have a rectangular (line-shaped) planar shape as viewed from the Z direction. In two vias VB and CB adjacent in the Z direction, a longitudinal direction (long axis direction) of the via VB intersects a longitudinal direction of the via CB.

In the present embodiment, the vias (via plugs, plugs) VB and CB as bonding members are also referred to as bonding vias.

In the present embodiment, the surfaces BF1 and BF2 of the memory cell array chip 10 and the CMOS circuit chip 11 to be bonded are referred to as bonding surfaces BF1 and BF2, respectively. In the chips 10 and 11, the bonding vias VB and CB are provided on the bonding surfaces BF1 and BF2 sides, respectively.

In the present embodiment, the bonding surfaces BF1 and BF2 of the semiconductor chips 10 and 11 correspond to front surfaces (top surfaces) of the semiconductor chips 10 and 11, respectively. Surfaces of the semiconductor chips 10 and 11 that are opposite to the bonding surfaces BF1 and BF2 in the Z direction correspond to back surfaces (bottom surfaces) of the semiconductor chips 10 and 11, respectively.

Structure Example

Figure 4:
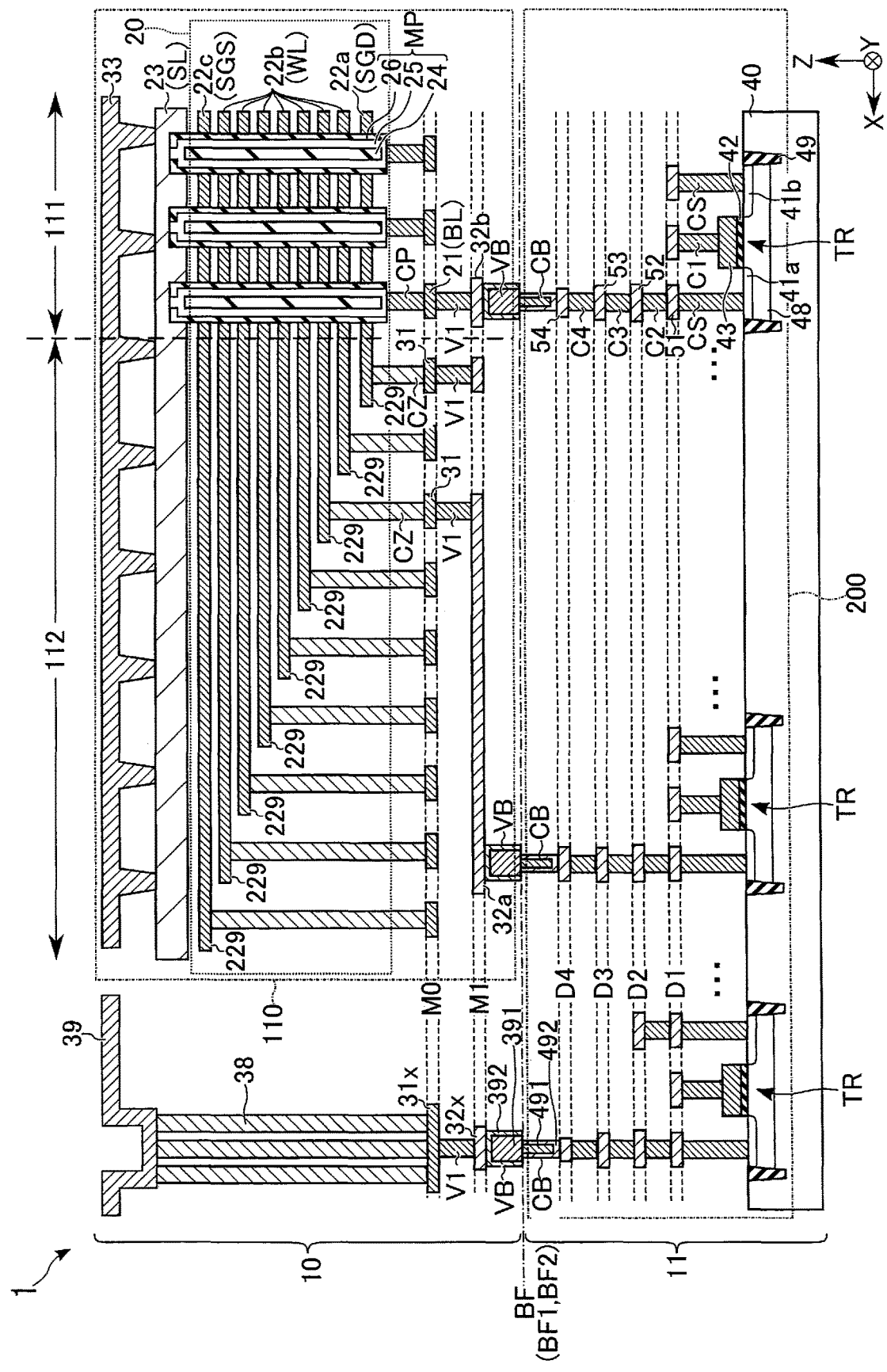
FIG. 4 is a cross-sectional view showing a cross-sectional structure of the memory device of the first embodiment.

FIG. 4 is a cross-sectional view showing an example of a structure of the memory device 1 of the embodiment.

In FIG. 4, a part of the memory device 1 is extracted and illustrated. For clarity, interlayer insulating films covering the elements of the memory device 1 are omitted.

As described above, the memory cell array chip 10 is bonded to the CMOS circuit chip 11. The memory cell array chip 10 is stacked on the CMOS circuit chip 11 in the Z direction. The bonding surface BF1 of the memory cell array chip 10 faces the bonding surface BF2 of the CMOS circuit chip 11. The bonding surface BF1 of the memory cell array chip 10 is in contact with the bonding surface BF2 of the CMOS circuit chip 11.

A surface of the memory cell array chip 10 on a side where the bit lines BL are provided is the bonding surface (front surface, top surface) BF1 of the memory cell array chip 10. A surface of the memory cell array chip 10 on a side where the source line SL is provided is the back surface of the memory cell array chip 10.

In the memory cell array chip 10, the memory cell array 110 includes a cell array area (also referred to as an element area) ill and a staircase area (also referred to as a hookup area) 112.

A plurality of conductive layers 21, 22, and 23 and insulating layers (not shown) are stacked in the Z direction and provided in the memory cell array 110.

In the memory cell array chip 10, a plurality of conductive layers 21 functioning as a plurality of bit lines BL are provided on the CMOS circuit chip 11 side (the front surface side of the memory cell array chip 10). The conductive layer 23 as the source line SL is provided above the bit lines BL (the back surface side of the memory cell array chip 10) in the Z direction. For example, if the conductive layer 23 is a silicon layer, a conductive layer 33 formed of a metal such as aluminum is provided on the conductive layer 23. This will lower the resistance of the source line SL.

A plurality of conductive layers 22 (22a, 22b, and 22c) and a plurality of insulating layers (not shown) are provided in the memory cell array 110. The conductive layers 22 are stacked in the Z direction. Each of the insulating layers is provided between two conductive layers 22 arranged in the Z direction.

The stacked conductive layers 22 are provided between an interconnect level (hierarchy, area) at which the source line SL is provided and an interconnect level at which the bit line BL is provided. The interconnect level indicates a position (height) in a direction perpendicular to the bonding surfaces BF1 and BF2 (or a front surface of a substrate 40).

Hereinafter, a structure 20 composed of a plurality of stacked conductive layers 22 and insulating layers will be referred to as a stacked interconnect 20.

A conductive layer 22a is used as a select gate line SGD on a drain side. A conductive layer 22c is used as a select gate line SGS on a source side. Each conductive layer 22b is used as a word line WL.

The conductive layer 22a as the select gate line SGD is provided between an interconnect level at which the plurality of conductive layers 22b are provided and an interconnect level M0 where the bit lines BL are provided. The conductive layer 22c as the select gate line SGS is provided between the interconnect level at which the conductive layers 22b are provided and the interconnect level at which the source line SL is provided. The conductive layers 22b as the word lines WL are provided between an interconnect level at which the conductive layer 22a is provided and an interconnect level at which the conductive layer 22c is provided.

A plurality of memory pillars MP are provided in the cell array area 111. For example, the memory pillars MP are arranged in a staggered grid shape in an X-Y plane of the cell array area 111.

Each memory pillar MP is provided in a hole (hereinafter referred to as a memory hole) extending in the Z direction and formed in the stacked interconnect 20. The memory pillar MP penetrates the stacked interconnect 20 in the Z direction. A side surface of the memory pillar MP faces the stacked interconnect 20.

One end of the memory pillar MP in the Z direction is coupled to the conductive layer 21 via a bit line contact CP. One end of the memory pillar MP is thereby electrically coupled to the bit line BL.

The other end of the memory pillar MP in the Z direction reaches the conductive layer 23. The other end of the memory pillar MP is thereby electrically coupled to the source line SL.

Each memory pillar MP includes a core portion 24, a semiconductor layer 25, and a memory layer 26. The core portion 24 extends in the direction Z. The semiconductor layer 25 covers a side surface of the core portion 24. The semiconductor layer 25 is provided between the core portion 24 and the memory layer 26. The memory layer 26 covers a side surface of the semiconductor layer 25. The memory layer 26 is provided between the semiconductor layer 25 and the stacked interconnect 20.

The semiconductor layer 25 is electrically coupled to the conductive layer 21 as the bit line BL. The semiconductor layer 25 is in direct contact with the conductive layer 23 as the source line SL via an opening portion formed in the memory layer 26.

Portions where the memory pillar MP faces the conductive layers 22b function as memory cells MT. A portion where the memory pillar MP faces the conductive layer 22a functions as a select transistor STD. A portion where the memory pillar MP faces the conductive layer 22c functions as a select transistor STS.

A configuration of the memory pillar MP in the present embodiment will be described more specifically with reference to FIG. 5. FIG. 5 is a cross-sectional view for explaining the configuration of the memory pillar MP. In FIG. 5, a cross section along the X-Y plane of the memory pillar MP at a position where the conductive layer 22b is arranged is shown.

For example, the memory pillar MP has a circular (or elliptic) plane shape as viewed from the Z direction. The semiconductor layer 25 covers the side surface of the cylindrical core portion 24. The memory layer 26 is provided between the semiconductor layer 25 and the conductive layer 22b.

The memory layer 26 includes a tunnel insulating layer 261, a charge storage layer 262, and a block insulating layer 263. The tunnel insulating layer 261, charge storage layer 262, and block insulating layer 263 are stacked in a direction parallel to the bonding surface (X-Y plane) BF1 of the memory cell array chip 10.

The tunnel insulating layer 261 is provided between the semiconductor layer 25 and the charge storage layer 262. The tunnel insulating layer 261 is a tunnel barrier between the semiconductor layer 25 and the charge storage layer 262. When a voltage of a certain magnitude is applied between the conductive layer 22b and the semiconductor layer 25, a charge moves between the semiconductor layer 25 and the charge storage layer 262 by tunneling. The tunnel insulating layer 261 includes a silicon oxide, for example.

The charge storage layer 262 is provided between the tunnel insulating layer 261 and the block insulating layer 263. For example, the charge storage layer 262 is a charge trap film that can retain (capture) charges. In this case, the charge storage layer 262 includes a silicon nitride. The charge storage layer 262 may be a floating gate electrode. The floating gate electrode includes silicon.

The block insulating layer 263 is provided between the charge storage layer 262 and the conductive layer 22b. The block insulating layer 263 prevents movement of a charge between the charge storage layer 262 and the conductive layer 22b. The block insulating layer 263 includes, for example, a silicon oxide and/or an aluminum oxide.

Returning to FIG. 4, the stacked interconnect 20 extends from the cell array area 111 to the staircase area 112. Within the staircase area 112, an end portion of the stacked interconnect 20 in the X direction has a staircase-shaped structure. Within the staircase area 112, one of the conductive layers 22 adjacent in the Z direction has a partially exposed portion without being covered by the other conductive layer 22. A portion 229 of one conductive layer 22 that is not covered by the other conductive layer 22 is referred to as a terrace 229. The terrace 229 is provided at a portion on the bonding surface BF1 side of the conductive layer 22. The terrace 229 faces the bonding surface BF1.

A contact (plug) CZ is coupled to the terrace 229 of the conductive layer 22. The contact CZ is coupled to the conductive layer 31 in the interlayer insulating film (not shown). The conductive layer 31 is provided in the same interconnect level M0 as the bit lines BL (conductive layers 21). The conductive layer 31 extends in, for example, the Y direction.

In the staircase area 112, a plurality of conductive layers (interconnects) 32a are provided in an interconnect level M1 between the conductive layers 21 and 31 and the bonding surface BF1.

For example, the conductive layers 32a extend in the X direction. For example, the conductive layers 32a are arranged in the Y direction at a certain pitch. One conductive layer 32a is coupled to a corresponding one of the plurality of conductive layers 31 via a via V1. Each conductive layer 32a is thereby coupled to a corresponding one of the word lines WL and select gate lines SGD and SGS.

Within the cell array area 111, a plurality of conductive layers (interconnects) 32b are provided in the interconnect level M1 between the conductive layers 21 and the bonding surface BF1. The conductive layer 32b is coupled to a corresponding one of the plurality of bit lines BL (conductive layers 21) via a via V1.

The via VB overlaps a portion of the conductive layer 32 (32a and 32b) in the Z direction. The via VB is provided further on the bonding surface BF side than the interconnect level M1, which is the furthest on the bonding surface BF1 side among the interconnect levels M0 and M1 of the memory cell array chip 10. The via VB is arranged in an interconnect level between the bonding surface BF1 and the interconnect level M1. The via VB is used as a bonding member (bonding via) of the memory cell array chip 10. For example, the via VB is embedded in a groove (e.g., a damascene groove) in the interlayer insulating film. The barrier metal 392 of the via VB is provided between the interlayer insulating film and the copper (or copper alloy) 391 of the via VB, and between the conductive layer 32 and the copper (or copper alloy) 391. Hereinafter, the copper 391 or copper alloy 391 that constitutes the via VB (or via CB) will also be referred to as a via member or main member.

The CMOS circuit chip 11 is provided below the memory cell array chip 10 in the Z direction.

The CMOS circuit chip 11 includes a plurality of field-effect transistors TR. The field-effect transistors TR are elements for forming the row control circuit 140, the sense amplifier circuit 150, the sequencer 190, etc. The field-effect transistors TR are, for example, MOS transistors.

Each field-effect transistor TR is provided in an active area (element formation area) of the semiconductor substrate 40. The active area is a semiconductor area delimited by an element isolation area. For example, a P-type or N-type well region 48 is provided in the active area. The active area may be an intrinsic semiconductor area. An insulating layer 49 is provided in the element isolation area.

Each field-effect transistor TR includes two source/drain layers 41a and 41b, a gate insulating layer 42, and a gate electrode 43.

The source/drain layers 41a and 41b are provided in the well region 48. The source/drain layers 41a and 41b include a P-type or N-type dopant, depending on the conduction type of the field-effect transistor TR. A region between the two source/drain layers 41a and 41b is a channel region of the field-effect transistor TR.

The gate insulating layer 42 (and the gate electrode 43) is provided on the channel region of the well region 48. The gate insulating layer 42 may be formed on the semiconductor substrate 40 in which the well region is not provided.

The gate electrode 43 is provided on the gate insulating layer 42. The gate electrode 43 faces the channel region with the gate insulating layer 42 interposed therebetween.

A plurality of conductive layers (interconnects) 51, 52, 53, and 54 are stacked in the Z direction. The conductive layers 51, 52, 53, and 54 are provided at a plurality of interconnect levels D1, D2, D3, and D4, respectively, in an interlayer insulating film (not shown) on the semiconductor substrate 40. The interlayer insulating film covers the field-effect transistors TR. The interlayer insulating film includes a plurality of insulating layers stacked in the Z direction.

The gate electrode 43 and source/drain layers 41 (41a and 41b) of the field-effect transistor TR are electrically coupled to contacts (plugs) C1 and CS, vias C2, C3, and C4 and conductive layers 51, 52, 53, and 54 in the interlayer insulating film.

The contact C1 is provided on the gate electrode 43. The contacts CS are provided on the source/drain layers 41. Each of the contacts C1 and CS is electrically coupled to the conductive layer 51 of the interconnect level D1.

The conductive layer 52 of the interconnect level D2 is coupled to the conductive layer 51 in the interconnect level D1 on the semiconductor substrate 40 side via the via C2. The conductive layer 52 of the interconnect level D2 is coupled to the conductive layer 53 of the interconnect level D3 on the bonding surface BF side via the via C3. The conductive layer 53 is coupled to the conductive layer 54 in the interconnect level D4 that is further on the bonding surface BF side than the interconnect level D3 via the via C4.

The plurality of field-effect transistors TR are electrically coupled to each other by a plurality of conductive layers 51, 52, 53, and 54, contacts C1 and CS, and vias C2, C3, and C4. This forms the CMOS circuit 200, such as the row control circuit 140, in the CMOS circuit chip 11.

Further, the transistor TR is electrically coupled to the conductive layers 21, 22, 23, 31, and 32 in the memory cell array chip 10 via the conductive layers 51, 52, 53, and 54, contacts C1 and CS, and vias C2, C3, and C4. This couples the CMOS circuit 200 to the memory cell array 110.

The via CB is provided on the conductive layer 54. The via CB is provided further on the bonding surface BF2 side than the interconnect level D4, which is the furthest on the bonding surface BF side among the interconnect levels D1, D2, D3, and D4 of the CMOS circuit chip 11. The via CB is arranged in an interconnect level between the bonding surface BF2 and the interconnect level D4. The via CB is used as a bonding member (bonding via) of the CMOS circuit chip 11. The via CB is in direct contact with the via VB. For example, the via CB is embedded in a groove (e.g., a damascene groove) within the interlayer insulating film. The barrier metal 492 of the via CB is provided between the interlayer insulating film and the via member (copper or copper alloy) 491, and between the via member 491 and the conductive layer 54.

For example, a conductive member 38 is provided in a hole of the memory cell array chip 10. The conductive member 38 is arranged side by side with the memory cell array 110 (and the memory pillars MP) in a direction (X or Y direction) parallel to the bonding surface BF1 of the memory cell array chip 10. The conductive member 38 extends in the memory cell array chip 10 in the Z direction. The conductive member 38 may consist of a plurality of contacts each having substantially the same X- and/or Y-direction dimensions as the contact CZ, as shown in FIG. 4, or it may consist of a single contact larger than the X- and/or Y-direction dimensions of the contact CZ.

For example, one end of the conductive member 38 in the Z direction is coupled to a conductive layer 31x of the interconnect level M0. The conductive layer 31x is coupled to a via VB via the via V1 and a conductive layer 32x. The conductive layer 32x is provided in the interconnect level M1. The conductive member 38 is electrically coupled to the elements in the CMOS circuit chip 11 (e.g., the transistor TR) via the vias VB and CB.

For example, the other end of the conductive member 38 in the Z direction is coupled to a conductive layer 39 provided on the back surface of the memory cell array chip 10.

Thereby, signals or voltages are supplied to the CMOS circuit chip 11 from the back surface side of the memory cell array chip 10 via the conductive member 38.

One end of the conductive member 38 in the Z direction may be coupled to the conductive layer 32x of the interconnect level M1 without passing through the conductive layer 31x and the via V1. The conductive member 38 may be coupled to the components (e.g., the substrate 40 or the interconnects 51 to 54) of the CMOS circuit chip 11 without passing through the conductive layers and vias in the memory cell array chip 10.

A resistance element (not shown) and a capacitance element (not shown) may be provided in the CMOS circuit chip 11.

As described above, in the memory device 1 of the present embodiment, the via VB of the memory cell array chip 10 and the via CB of the CMOS circuit chip 11 are used as bonding members of the two semiconductor chips 10 and 11. The via VB of the memory cell array chip 10 is joined to the via CB of the CMOS circuit chip 11.

The two semiconductor chips 10 and 11, which constitute the memory device 1, are thus bonded together.

The numbers of interconnect levels of the memory cell array chip 10 and the CMOS circuit chip 11 are not limited to the above-described numbers.

(1b) Configurations of Bonding Members VB and CB

Figure 6:
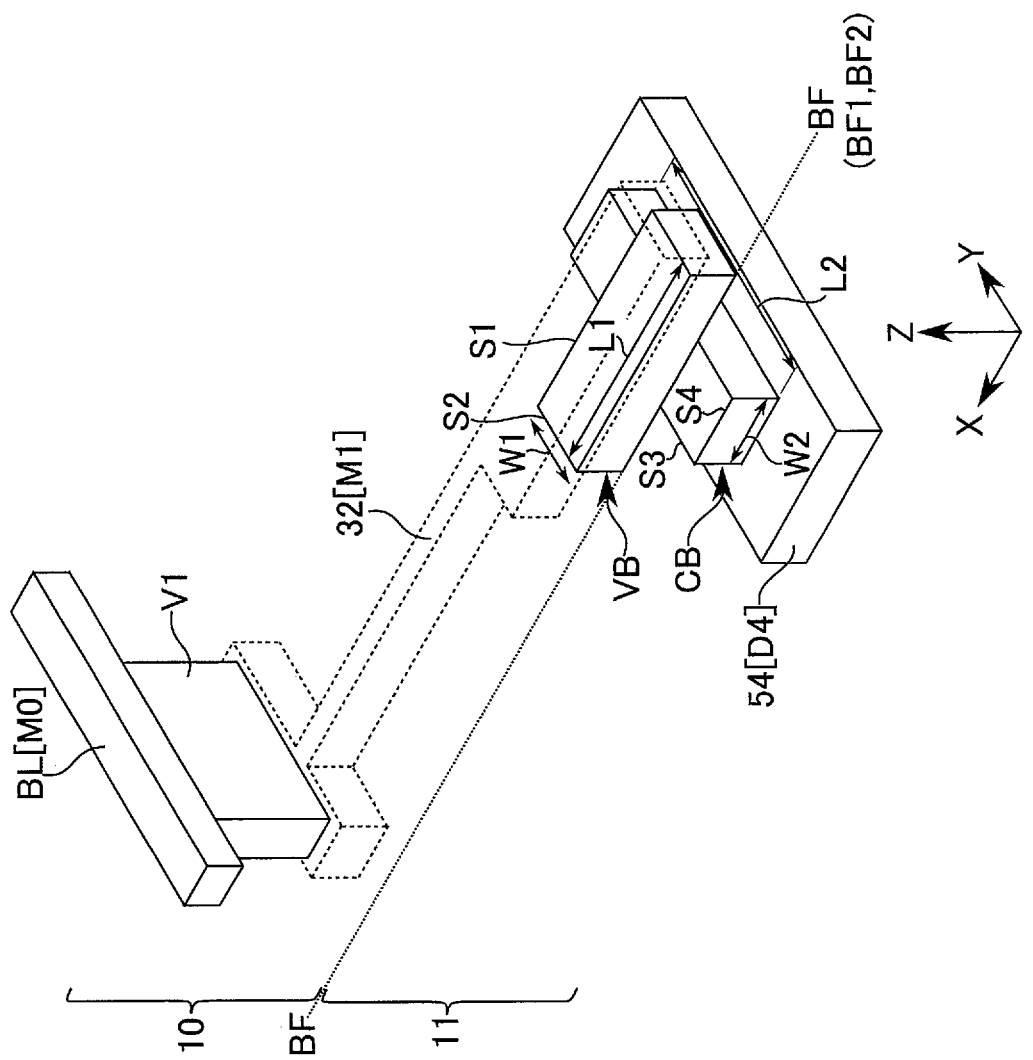
FIG. 6 is a bird's-eye view showing an exemplary structure of a bonding portion of the memory device of the first embodiment.
Figure 7:
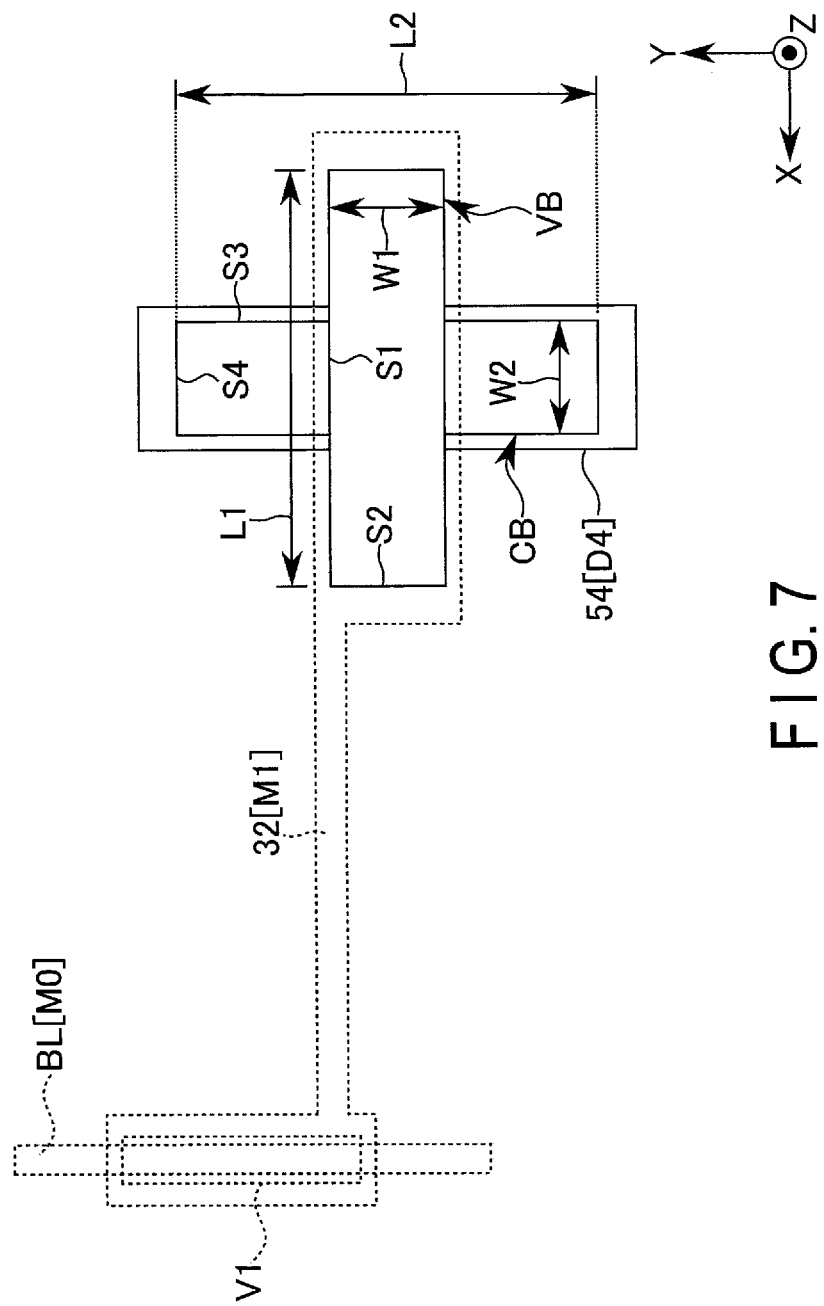
FIG. 7 is a plan view showing an exemplary structure of the bonding portion of the memory device of the first embodiment.
Figure 8:
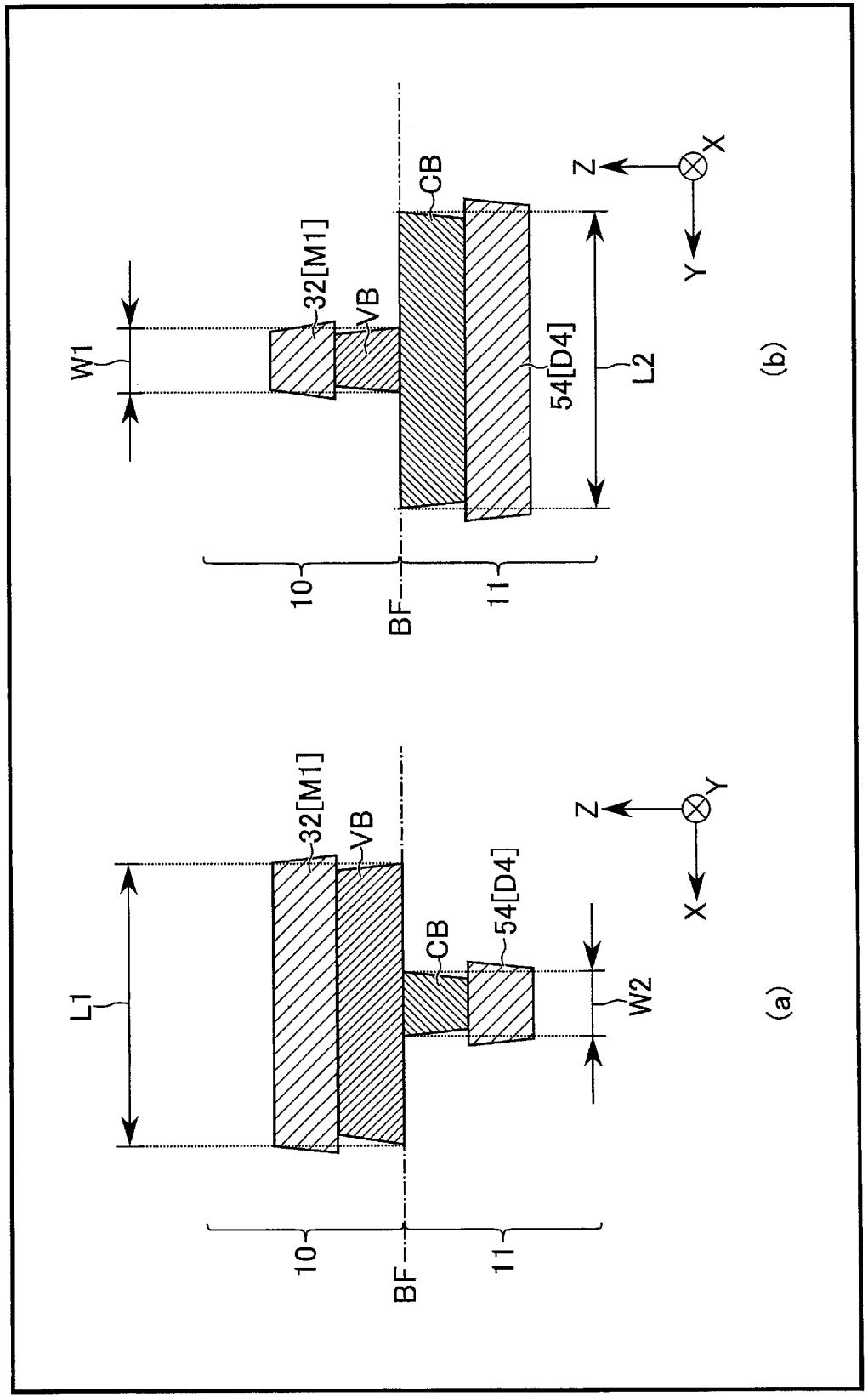
FIG. 8 is a cross-sectional view showing an exemplary structure of the bonding portion of the memory device of the first embodiment.

Configuration examples of the bonding members VB and CB of the memory device 1 of the present embodiment will be described with reference to FIGS. 6, 7, and 8. FIG. 6 is a schematic bird's-eye view for explaining structures of the bonding members VB and CB in the memory device 1 of the present embodiment. FIG. 7 is a schematic plan view for explaining the structures of the bonding members VB and CB in the memory device 1 of the present embodiment. FIG. 8 is a schematic cross-sectional view for explaining the structures of the bonding members VB and CB in the memory device 1 of the present embodiment. In (a) of FIG. 8, a cross-sectional structure of the bonding members VB and CB as viewed from the Y direction is shown. In (b) of FIG. 8, a cross-sectional structure of the bonding members VB and CB as viewed from the X direction is shown.

In FIGS. 6 and 7, some of the components are shown with dashed or dotted lines for clarity.

As shown in FIGS. 6 to 8, the bonding via (bonding member) VB of the memory cell array chip 10 is exposed from the bonding surface BF1 of the memory cell array chip 10. The bonding via CB of the CMOS circuit chip 11 is exposed from the bonding surface BF2 of the CMOS circuit chip 11.

The bonding via VB is in direct contact with the bonding via CB at the bonding surface BF (BF1 and BF2).

Each of the bonding vias VB and CB has a rectangular planar shape as viewed from the Z direction (bonding surface BF). The bonding vias VB and CB may have a rectangular planar shape with chipped corners or an elliptic planar shape, as long as the planar shape of each of the bonding vias VB and CB has a longitudinal direction (long axis direction) and a width direction (short axis direction) as viewed from the Z direction.

A side S1 of the bonding via VB in a longitudinal direction is along a first direction (e.g., the X direction). A side S2 of the bonding via VB in a width direction is along a second direction (e.g., the Y direction). The second direction is parallel to the bonding surface BF and intersecting (e.g., orthogonal to) the first direction.

A side S3 of the bonding via CB in a longitudinal direction is along the second direction. A side S4 of the bonding via CB in a width direction is along the first direction.

As such, the longitudinal directions of the two bonding vias VB and CB are along different directions from each other. Also, the width directions of the two bonding vias VB and CB are along different directions from each other. Hence, when the two semiconductor chips 10 and 11 are bonded, the longitudinal direction (side S1) of the bonding via VB intersects the longitudinal direction (side S2) of the bonding via CB. For example, the longitudinal direction of the bonding via VB is orthogonal to the longitudinal direction of the bonding via CB. As viewed from the Z direction, the side S1 of the bonding via VB intersects the side S3 of the bonding via CB at a 90-degree angle.

A pair of two bonding vias VB and CB in a bonded state has a cross-shaped overlapping structure as viewed from the Z direction.

A dimension W1 of the side S2 of the bonding via VB in the width direction is different from a dimension L1 of the side S1 of the bonding via VB in the longitudinal direction. The dimension W1 of the side S2 of the bonding via. VB in the width direction is smaller than the dimension L1 of the side S1 of the bonding via VB in the longitudinal direction.

A dimension W2 of the side S4 of the bonding via CB in the width direction is different from a dimension L2 of the side S3 of the bonding via CB in the longitudinal direction. The dimension W2 of the side S4 of the bonding via CB in the width direction is smaller than the dimension L2 of the side S3 of the bonding via CB in the longitudinal direction.

The dimension L2 may be substantially the same as or different from the dimension L1. The dimension W2 may be substantially the same as or different from the dimension W1.

The bonding via VB is coupled to the conductive layer 32 in the interconnect level M1. The bonding via VB is provided under (on) the conductive layer 32. The conductive layer 32 is coupled to the conductive layer (e.g., the bit lint BL) in the interconnect level M0 via the via V1. The bonding via VB overlaps a portion of the rectangular shape of the conductive layer 32 in the Z direction.

The bonding via CB is provided on the rectangular conductive layer 54 in the interconnect level D4. The bonding via CB overlaps the conductive layer 54 in the Z direction.

For example, each of the bonding vias VB and CB has a tapered cross-sectional shape as viewed from the Y direction (or the X direction). A dimension of the bonding via VB on the bonding surface BF side in the X direction is larger than that of the bonding via VB on the conductive layer 32 side in the X direction. Further, a dimension of the bonding via VB on the bonding surface BF side in the Y direction is larger than that of the bonding via VB on the conductive layer 32 side in the Y direction. A dimension of the bonding via CB on the bonding surface BF side in the X direction is larger than that of the bonding via CB on the conductive layer 54 side in the X direction. Further, a dimension of the bonding via CB on the bonding surface BF side in the Y direction is larger than that of the bonding via CB on the conductive layer 54 side in the Y direction.

In the memory device 1 of the present embodiment, the two semiconductor chips 10 and 11 are joined by the vias VB and CB without providing pads for bonding in interconnect levels that are further on the bonding surface BF side than the vias VB and CB. This reduces the number of components and/or steps for joining the two semiconductor chips 10 and 11.

(1c) Layout of Bonding Members VB and CB

Referring to FIGS. 9 through 15, a layout of the bonding vias VB and CB in the memory device 1 of the present embodiment will be described.

Figure 9:
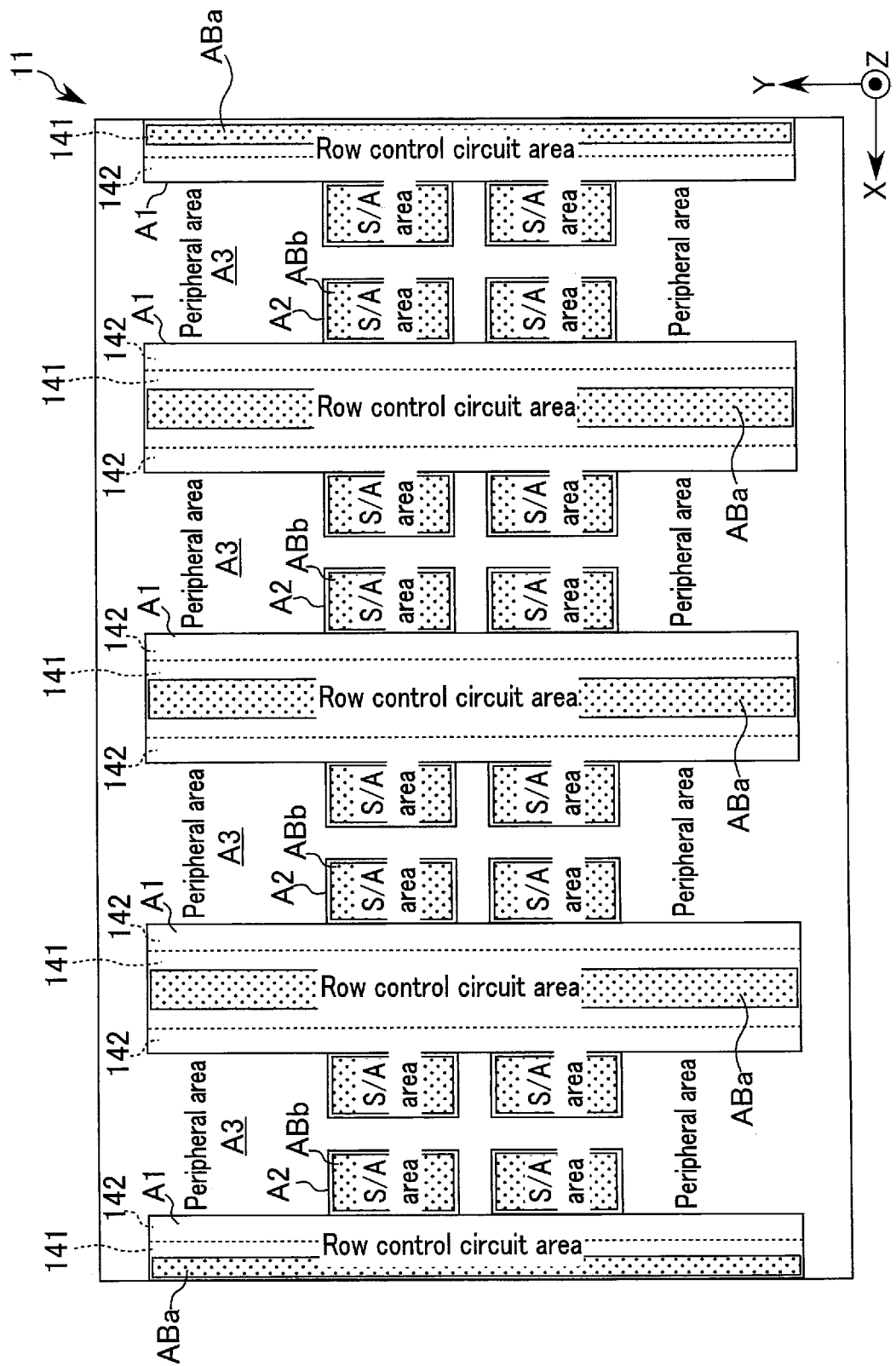
FIG. 9 is a top view showing an example of a layout of the memory device of the first embodiment.
Figure 10:
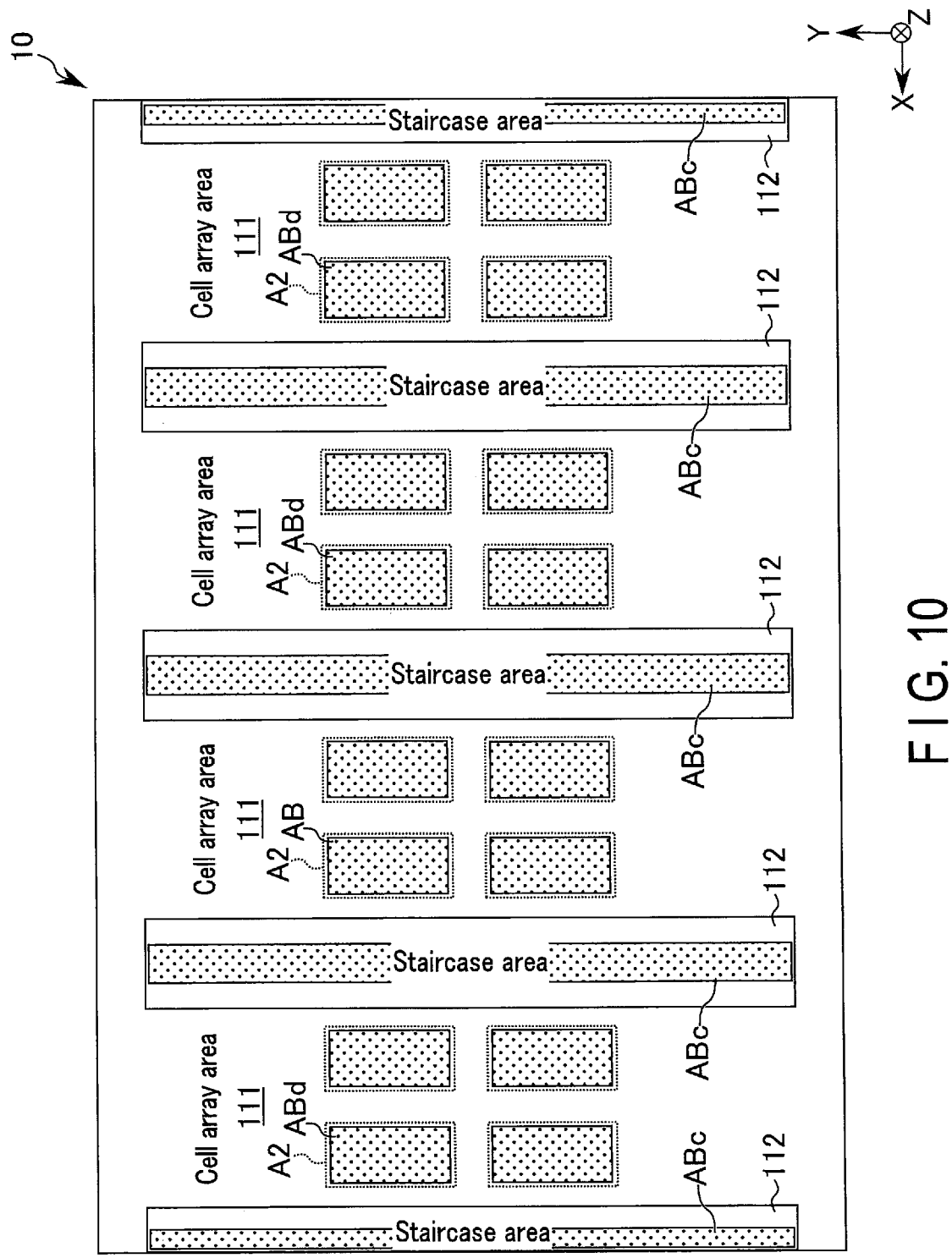
FIG. 10 is a top view showing an example of a layout of the memory device of the first embodiment.

FIG. 9 is a top view schematically showing an area in which the bonding via CB of the CMOS circuit chip 11 is arranged in the memory device 1 of the present embodiment. FIG. 10 is a top view schematically showing an area in which the bonding via VB of the memory cell array chip 10 is arranged in the memory device 1 of the present embodiment.

As shown in FIGS. 9 and 10, in the semiconductor chips 10 and 11, the bonding vias VB and CB are arranged in certain areas AB (ABa, ABb, ABc, and ABd). Hereafter, the areas in which the bonding vias VB and CB are arranged will be referred to as bonding via areas AB.

In FIG. 9, a layout of the bonding via areas AB (ABa and ABb) in the CMOS circuit chip 11 is shown.

As shown in FIG. 9, the CMOS circuit chip 11 includes a plurality of row control circuit areas A1, a plurality of sense amplifier areas (S/A areas) A2, and a plurality of peripheral areas A3.

Each row control circuit area A1 is an area in which a word line switch 141 and a block decoder 142 are arranged. A plurality of row control circuit areas A1 are arranged in the X direction in the CMOS circuit chip 11.

Each sense amplifier area A2 is an area in which the sense amplifier circuit 150 is arranged. Four sense amplifier areas A2 are arranged in a 2×2 layout in a space between two row control circuit areas A1 adjacent in the X direction.

Each peripheral area A3 is an area in which circuits other than the row control circuit 140 and the sense amplifier circuit 150 are arranged. For example, the registers 120 and 130, the voltage generator 170, the sequencer 190, etc. are arranged in the peripheral area A3. The peripheral area A3 is arranged in a space surrounding the row control circuit areas A1 and the sense amplifier areas A2.

The CMOS circuit chip 11 includes a plurality of bonding via areas ABa and ABb.

In the CMOS circuit chip 11, the bonding via area ABa is arranged at a position overlapping the row control circuit area A1 in the Z direction. For example, the bonding via area ABa is arranged at a position overlapping an arrangement area of the word line switch 141 in the row control circuit area A1.

The bonding via CB in the bonding via area ABa is electrically coupled to the components of the row control circuit 140 below the bonding via area ABa via a plurality of vias C2 to C4, conductive layers 51 to 54, and contacts C1 and CS.

The bonding via area ABb is arranged at a position overlapping the sense amplifier area A2 in the Z direction. The bonding via CB in the bonding via area ABb is electrically coupled to the components of the sense amplifier circuit 150 below the bonding via area ABb via a plurality of vias C2 to C4, conductive layers 51 to 54, and contacts C1 and CS.

In FIG. 10, a layout of the bonding via areas AB (ABc and ABd) in the memory cell array chip 10 is shown.

As shown in FIG. 10, the memory cell array chip 10 includes a plurality of bonding via areas ABc and ABd.

In the memory cell array chip 10, the bonding via area ABc is provided at a position overlapping a portion of the staircase area 112 of the memory cell array chip 10 in the Z direction. For example, the bonding via area ABc overlaps the row control circuit area A1 of the CMOS circuit chip 11 in the Z direction.

The bonding via area ABd is provided at a position overlapping the cell array area 111 of the memory cell array chip 10 in the Z direction. For example, the bonding via area ABd overlaps the sense amplifier area A2 of the CMOS circuit chip 11 in the Z direction.

The memory cell array chip 10 and the CMOS circuit chip 11 may further include an area (not shown) in which a power supply pad (or a power supply via) is arranged and an area (not shown) in which an input/output pad (or an input/output via) is arranged.

<Layout Relating to Rows of Memory Cell Array 110>

Figure 11:
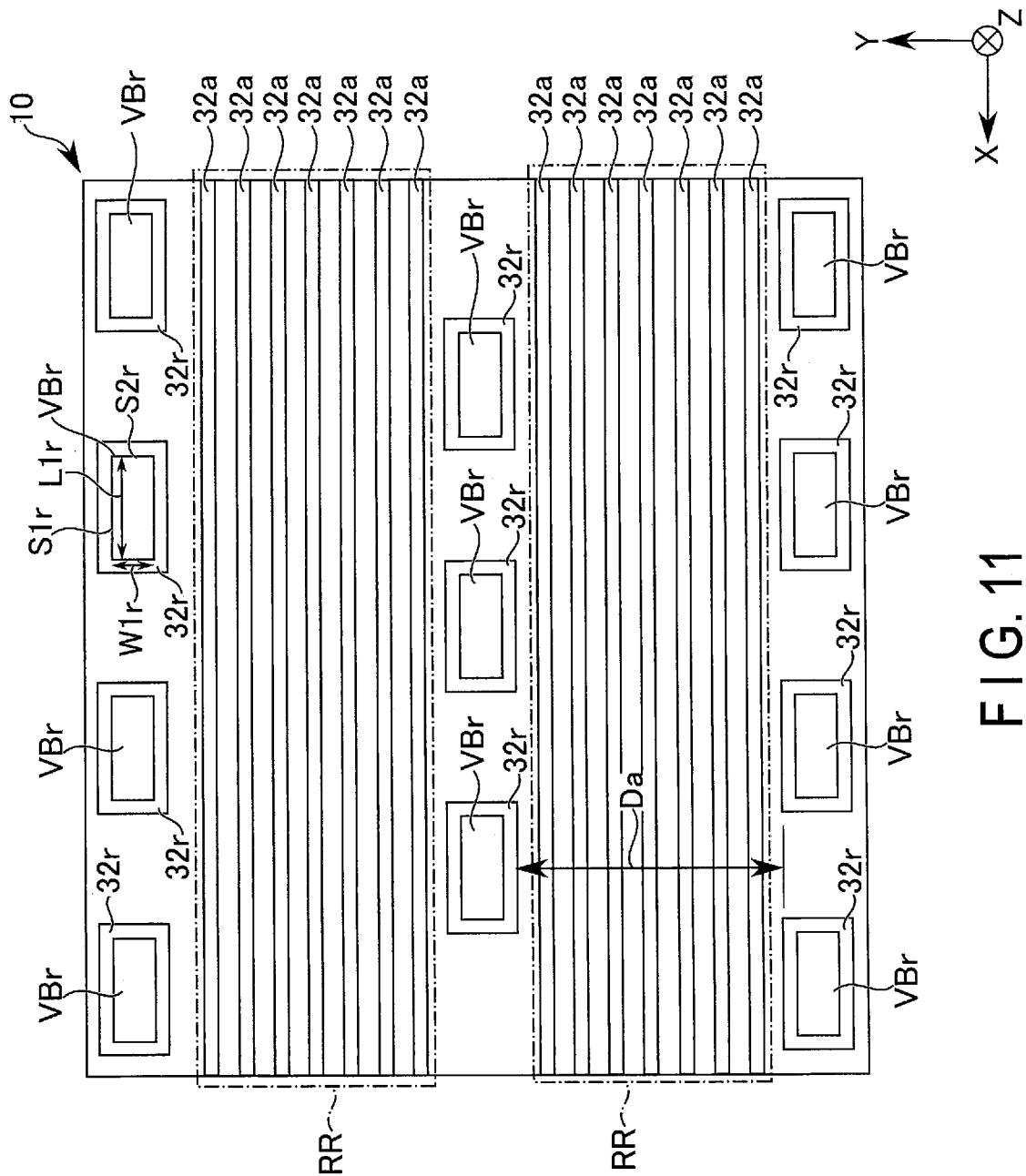
FIG. 11 is a top view showing an example of a layout of the memory device of the first embodiment.

FIG. 11 is a top view showing an example of a layout of bonding vias VBr and various types of interconnects in the memory cell array chip 10 relating to the rows of the memory cell array 110 in the memory device 1 of the present embodiment.

As shown in FIG. 11, a plurality of conductive layers (interconnects) 32a are provided in the staircase area 112. The conductive layers 32a are arranged in the Y direction. For example, each conductive layer 32a extends in the X direction. As described above, each conductive layer 32a is arranged in the interconnect level M1 that is further on the bonding surface BF1 side than the interconnect level M0 of the bit line BL.

The conductive layers 32a are' arranged in a region RR between conductive layers 32r arranged in the Y direction. The region RR provided with the conductive layers 32a is provided between one row of a plurality of conductive layers 32r arranged in the X direction and another row of a plurality of conductive layers 32r arranged in the X direction.

For example, one end of a conductive layer 32a is electrically coupled to any one of the conductive layers 22 in the stacked interconnects 20 via a via V1, a conductive layer 31, and a contact CZ.

A plurality of bonding vias VBr are provided in the bonding via area ABc.

The bonding via VBr is provided on the conductive layer 32r as viewed from the bonding surface BF1 side. The conductive layers 32r are provided in the same interconnect level M1 as the interconnects 32a. The conductive layer 32r has a rectangular planar shape as viewed from the Z direction. A dimension of the conductive layer 32r in the Y direction is smaller than that of the conductive layer 32r in the X direction. The conductive layer 32r may be electrically coupled to the conductive layer 32a. The bonding vias VBr are provided further on the bonding surface BF1 side than the interconnect level M1 at which the conductive layers 32r are provided. An upper surface (a surface on the CMOS circuit chip 11 side) of the bonding via VBr is exposed from the bonding surface BF1. The bonding via VBr is joined to a bonding via CBr to be described later in the CMOS circuit chip 11 so that longitudinal directions of the bonding vias VBr and CBr intersect each other.

For example, the bonding vias VBr adjacent in the Y direction are arranged at a certain pitch. The bonding vias VBr adjacent in the X direction are arranged at a certain pitch.

The conductive layers 32r adjacent in the Y direction are arranged at a certain pitch. The conductive layers 32r adjacent in the X direction are arranged at a certain pitch.

The bonding via VBr is coupled to a corresponding conductive layer (e.g., conductive layer 31, word line WL, or select gate line SGD or SGS) in an interconnect level different from the bonding surface BF1 via the conductive layer 32r and the via V1. The bonding via VBr may be coupled to the other end of a conductive layer 32a via the conductive layer 32r or directly.

The bonding via VBr does not have to be coupled to a conductive layer (e.g., conductive layer 31) in an interconnect level different from the conductive layer 32r, as long as the bonding via VBr is joined to the bonding via CB in the CMOS circuit chip 11.

A side S1r of the bonding via VBr in the longitudinal direction is along the X direction. A side S2r of the bonding via VBr in a width direction is along the Y direction. A dimension W1r of the bonding via VBr in the Y direction is smaller than a dimension L1r of the bonding via VBr in the X direction.

An area of the conductive layer 32r as viewed from the Z direction is set according to the dimensions of the bonding via VBr. For example, the area (dimensions in the X and Y directions) of the conductive layer 32r is larger than an area (dimensions in the X and Y directions) of the bonding via VBr. If a length of a side of a rectangular-shaped bonding via in a longitudinal direction is the same as a length of one side of a square-shaped bonding via, an area of the rectangular-shaped bonding via VB (or bonding via CB) is smaller than that of the square-shaped bonding member (e.g., bonding pad).

As in the present embodiment, the dimension of the conductive layer 32r in the Y direction on which the bonding member is arranged can be reduced by reduction of the dimension W1r of the bonding member VBr in the width direction through the use of the via. This expands a distance Da between two conductive layers 32r in the Y direction. As a result, the number of conductive layers 32a arranged in the space between the conductive layers 32r can be increased.

Alternatively, a pitch margin between adjacent conductive layers 32a can be improved.

Alternatively, an area of the bonding via area ABc can be reduced by reducing the dimension of the conductive layer 32r in the Y direction on which the bonding member is arranged. As a result, a chip size of the memory cell array chip 10 can be reduced.

As such, with respect to the rows of the memory cell array 110, an area is secured for interconnect routing within the memory cell array chip 10. As a result, inhibition of interconnect passage in the bonding via areas AB is suppressed.

Figure 12:
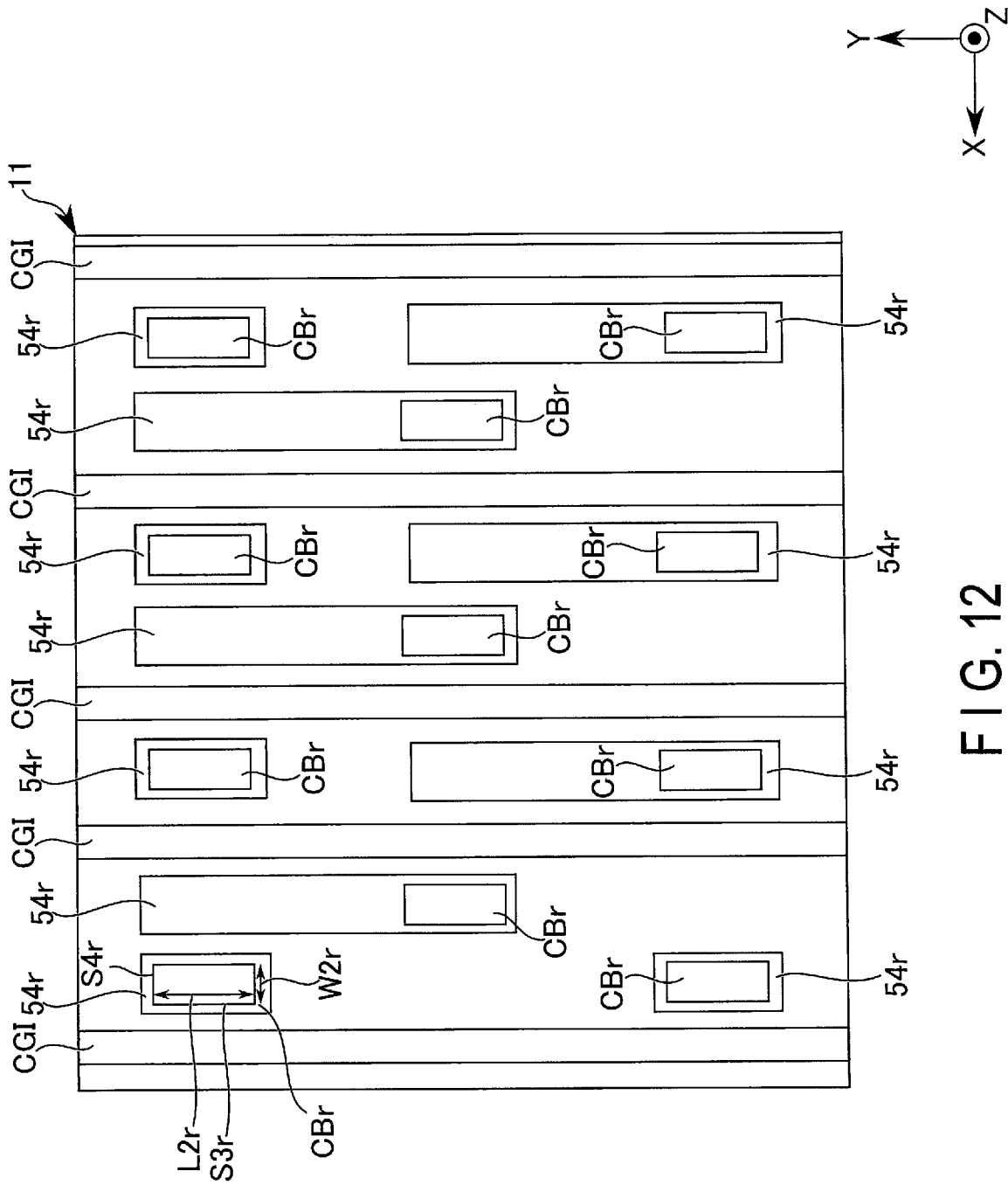
FIG. 12 is a top view showing an example of a layout of the memory device of the first embodiment.

FIG. 12 is a top view showing an example of a layout of bonding vias CBr and various types of interconnects in the CMOS circuit chip 11 relating to the rows of the memory cell array 110 in the memory device 1 of the present embodiment.

A plurality of conductive layers (interconnects) CGI are arranged in the row control circuit areas A1 in the CMOS circuit chip 11. The conductive layers CGI extend in, for example, the Y direction. The conductive layers CGI are, for example, arranged in the X direction. For example, the conductive layers CGI are provided in an interconnect level (e.g., the interconnect level D4) below the bonding vias CBr.

A plurality of bonding vias CBr are provided in the bonding via areas ABa.

Each bonding via CBr is provided on a conductive layer 54r as viewed from the bonding surface BF side. The conductive layer 54r is provided in the same interconnect level as the conductive layer CGI. The conductive layer 54r has a rectangular planar shape as viewed from the Z direction. A dimension of the conductive layer 54r in the X direction is smaller than that of the conductive layer 54r in the Y direction. The bonding via CBr is provided further on the bonding surface BF2 side than the interconnect level at which the conductive layer 54r is provided. An upper surface (a surface on the memory cell array chip 10 side) of the bonding via CBr is exposed from the bonding surface BF2. The bonding via CBr is joined to the above-described bonding via VBr so that the longitudinal directions of the bonding vias VBr and CBr intersect each other. This causes the two bonding vias VBr and CBr to overlap each other in a cross shape as viewed from the Z direction.

The bonding vias CBr are coupled to an interconnect or element (e.g., the transistor TR) in the CMOS circuit chip 11 via conductive layers 51 to 54r, vias C2 to C4, and contacts C1 and CS. The bonding via CBr may be coupled to the conductive layer CGI.

The bonding via CBr does not have to be coupled to a conductive layer at an interconnect level different from the conductive layer 54r, as long as the bonding via CBr is joined to the bonding via VBr.

A side S3r of the bonding via CBr in the longitudinal direction is along the Y direction. A side S4r of the bonding via CBr in a width direction is along the X direction. A dimension W2r of the bonding via CBr in the X direction is smaller than a dimension L2r of the bonding via CBr in the Y direction. In a state where the bonding via CBr is joined to the bonding via VBr, the side S3r of the bonding via CBr in the longitudinal direction is substantially orthogonal to the side S1r of the bonding via VBr in the longitudinal direction along the bonding surface BF.

An area of the conductive layer 54r as viewed from the Z direction is set according to the dimensions of the bonding via CBr. For example, the area (dimensions in the X and Y directions) of the conductive layer 54r is larger than an area (dimensions in the X and Y directions) of the bonding via CBr.

As in the present embodiment, the dimension of the conductive layer 54r in the X direction can be reduced by reduction of the dimension W2r of the bonding member CBr through the use of the via. This expands spacing between two conductive layers 54r arranged in the X direction with one or more conductive layers CGI sandwiched therebetween. As a result, the number of interconnects arranged in the space between the conductive layers 54r and in a space below the conductive layers 54r can be prevented from being limited.

Alternatively, a pitch margin between the conductive layer 54r and the conductive layer CGI can be improved.

Alternatively, the area of the bonding via area ABa can be reduced by reduction of the dimension of the conductive layer 54r in the X direction. As a result, the chip size of the CMOS circuit chip 11 can be reduced.

Thus, with respect to the rows of the memory cell array 110, an area is secured for interconnect routing within the CMOS circuit chip 11. As a result, inhibition of interconnect passage within the bonding via areas AB is suppressed.

<Interconnect Layout Relating to Columns of Memory Cell Array 110>

Referring to FIGS. 13 through 19, several examples of layouts of the interconnects and bonding vias VB and CB relating to the columns of the memory cell array 110 will be described.

Example 1

Figure 13:
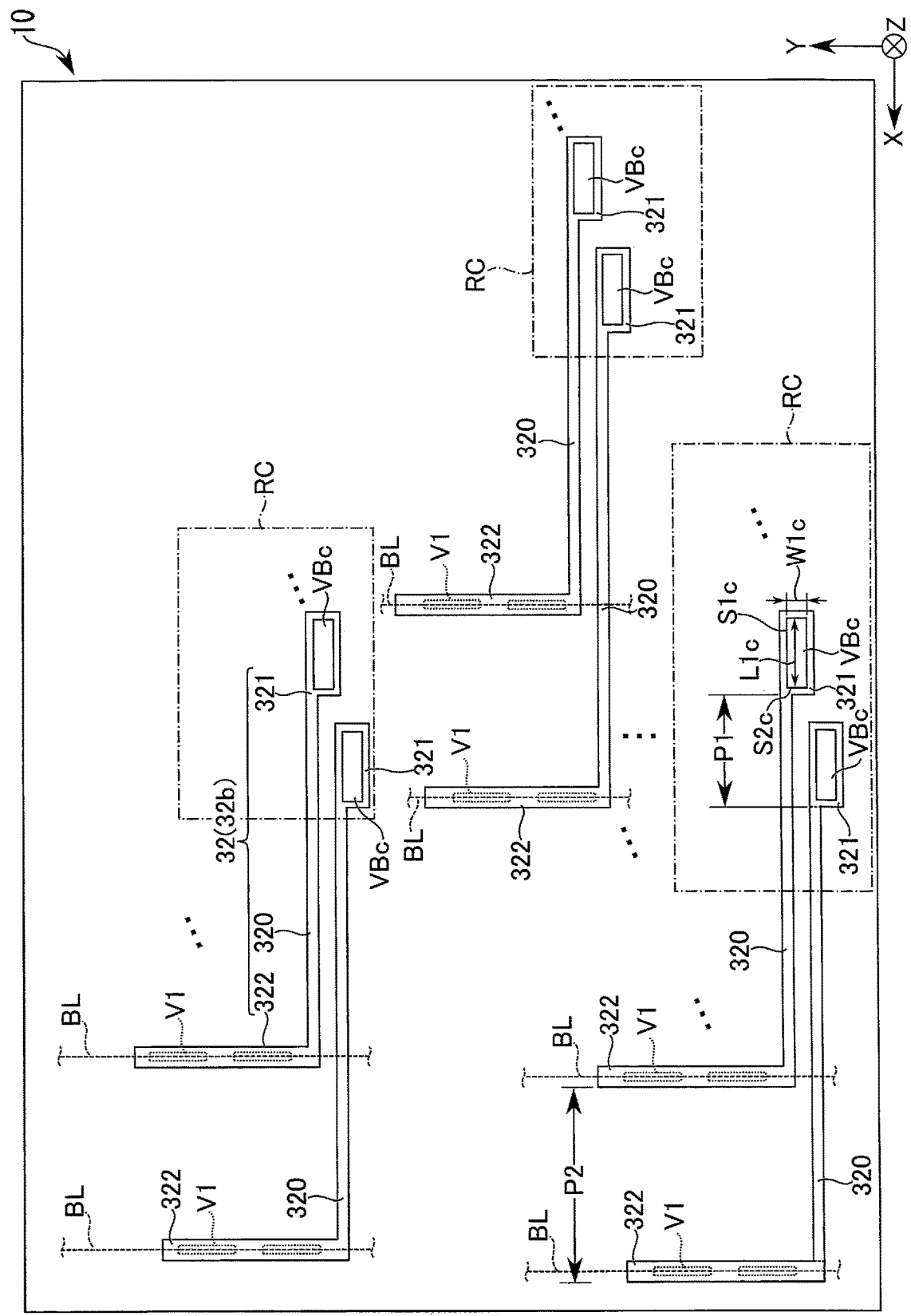
FIG. 13 is a top view showing an example of a layout of the memory device of the first embodiment.

FIG. 13 is a top view showing an example of a layout of bonding vias VBc and various types of interconnects in the memory cell array chip 10 relating to the columns of the memory cell array 110 in the memory device 1 of the present embodiment.

A plurality of bonding vias VBc are provided in the bonding via areas ABd.

The bonding vias VBc are arranged at a predetermined pitch and diagonally to the X and Y directions in the X-Y plane.

Each bonding via VBc is coupled to a corresponding bit line BL in an interconnect level different from the bonding surface BF1 via a conductive layer 320, conductive layers 321 and 322, and a via V1.

A plurality of conductive layers (hereinafter also referred to as interconnect portions) 320 extend in the X direction between the bit line BL and the bonding via VBc. The conductive layers 320 are provided in the interconnect level M1 between the interconnect level M0 of the bit line BL and the interconnect level of the bonding via VBc.

The conductive layer 320 is coupled to the conductive layers 321 and 322 in the interconnect level M1. The conductive layer 320, conductive layer 321, and conductive layer 322 are one continuous layer 32 (32b) in the interconnect level M1.

The conductive layer 320 is electrically coupled to the bit line BL via the conductive layer 322 and the via V1. The conductive layer 320 is coupled to the bonding via VBc via the conductive layer 321.

Each bonding via VBc is provided on the conductive layer 321 as viewed from the bonding surface BF side.

A plurality of conductive layers 321 are provided in a region RC of the bonding via area ABd. The conductive layers 321 in the region RC are arranged diagonally to the X and Y directions in the X-Y plane. The conductive layer 321 has a rectangular planar shape as viewed from the Z direction. A dimension of the conductive layer 321 in the Y direction is smaller than that of the conductive layer 321 in the X direction. For example, one conductive layer 321 is adjacent to a conductive layer 320 coupled to another conductive layer 321 in the Y direction.

Two conductive layers 321 adjacent in the X direction have a certain pitch P1. For example, the pitch P1 has a dimension that allows a predetermined number of (e.g., eight) interconnects to line up in the X direction within the sense amplifier area A2 in the CMOS circuit chip 11.

For example, two bonding vias VBc adjacent in the X direction have a certain pitch (e.g., the pitch P1).

The conductive layer 322 extends in the Y direction so that the conductive layer 322 partially overlaps the bit line BL in the Z direction.

Two conductive layers 322 adjacent in the X direction have a certain pitch P2. For example, the pitch P2 has a dimension that allows a predetermined number (e.g., 128) of multiple bit lines BL to line up in the X direction. For example, the pitch P2 is larger than the pitch P1.

The bonding via VBc is provided further on the bonding surface BF1 side than the interconnect level M1 at which the conductive layer 321 is provided. An upper surface of the bonding via VBc (a surface on the CMOS circuit chip 11 side) is exposed from the bonding surface BF1. The bonding via VBc is joined to a bonding via CBc to be described later in the CMOS circuit chip 11 so that longitudinal directions of the bonding vias VBc and CBc intersect each other.

A side Sic of the bonding via VBc in the longitudinal direction is along the X direction. A side S2c of the bonding via VBc in a width direction is along the Y direction. A dimension W1c of the bonding via VBc in the Y direction is smaller than a dimension L1c of the bonding via VBc in the X direction.

An area of the conductive layer 321 as viewed from the Z direction is set according to the dimensions of the bonding via VBc. For example, the area (dimensions in the X and Y directions) of the conductive layer 321 is larger than an area (dimensions in the X and Y directions) of the bonding via VBc.

As in the present embodiment, the dimension of the conductive layer 321 in the Y direction can be reduced by reduction of the dimension W1c of the bonding member VBc in the width direction through the use of the via. This reduces the pitch between the conductive layers 320 in the Y direction and the pitch between the conductive layers 321 in the Y direction. As a result, the number of conductive layers 321 (and the number of conductive layers 320) arranged in one region RC can be increased.

Alternatively, a pitch margin between the conductive layers 321 in the Y direction can be improved.

Alternatively, the area of the region RC is reduced by reduction of the area of the conductive layer 321.

Thus, with respect to the columns of the memory cell array 110, an area is secured for interconnect routing within the memory cell array chip 10. As a result, inhibition of interconnect passage in the bonding via areas AB is suppressed.

Referring to FIGS. 14 through 17, a layout of the bonding vias CBc of the CMOS circuit chip 11 relating to the columns of the memory device 1 of the present embodiment will be described.

Figure 14:
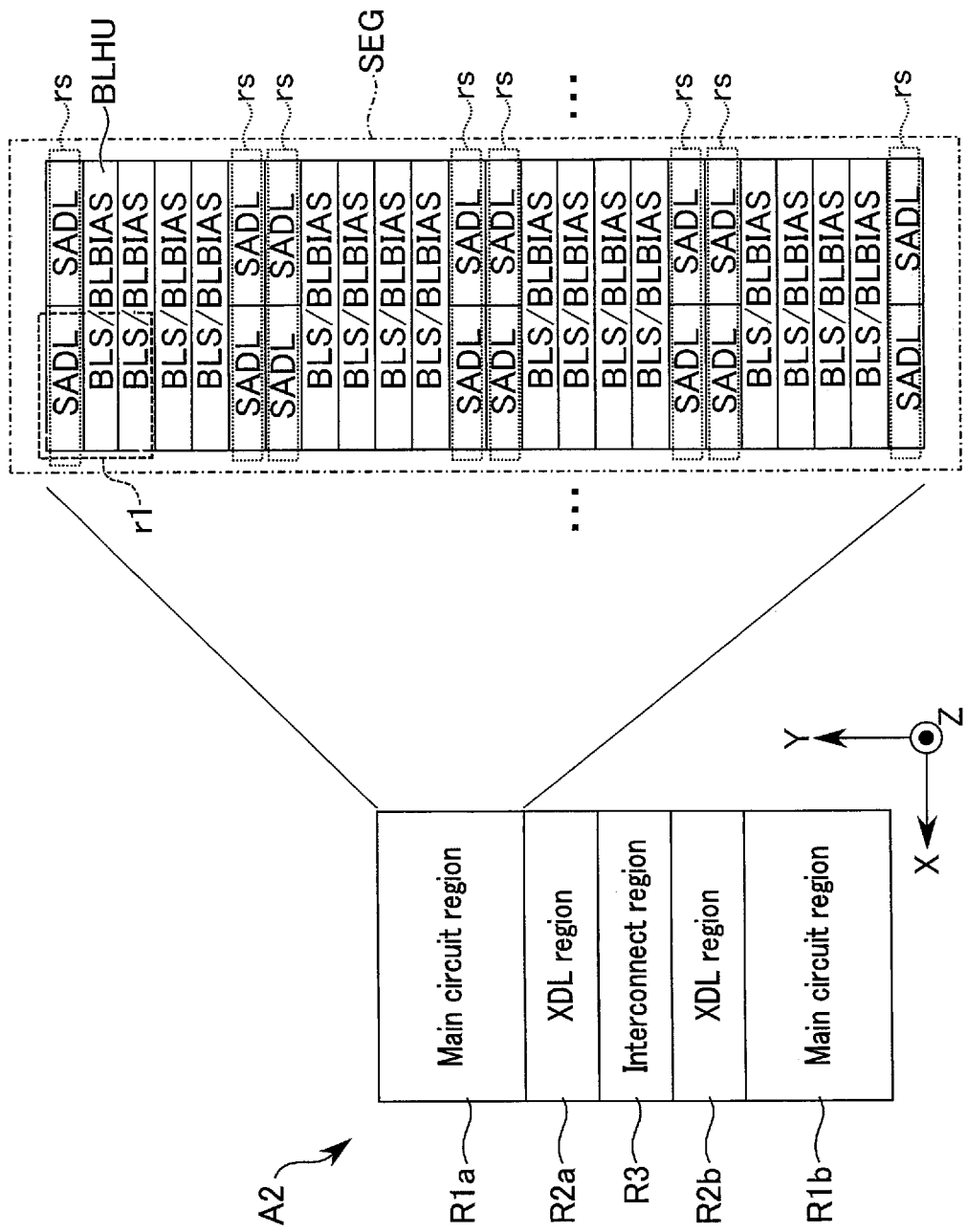
FIG. 14 is a top view showing an example of a layout of the memory device of the first embodiment.

FIG. 14 is a top view showing an example of a layout in the sense amplifier area A2 in the memory device 1 of the present embodiment.

One sense amplifier area A2 includes circuit regions R1 (R1a and R1b), cache circuit regions R2 (R2a and R2b), and an interconnect region R3.

The circuit region R1a is aligned with the circuit region R1b in the Y direction. The cache circuit region R2a is aligned with the cache circuit region R2b in the Y direction between the two circuit regions Ria and Rib. The interconnect region R3 is provided between the cache circuit regions R2a and R2b.

The cache circuit region R2 is a region in which a plurality of data latches XDL that constitute the cache circuit 153 are provided.

The interconnect region R3 is a region in which interconnects, vias, and elements (circuits) for coupling the sense amplifier circuit 150 and the input/output circuit 180 are provided.

The circuit region R1 includes a plurality of sense amplifier unit arrangement regions SADL and a plurality of hookup regions BLHU (BLS/BLBIAS).

In FIG. 14, one region (segment) SEG indicating a layout of a plurality of regions SADL and BLHU is shown. For example, a plurality of regions SEG are arranged in the X direction within each sense amplifier area A2.

The sense amplifier unit arrangement region SADL is a region in which the sense amplifier unit 151 and the data latch circuit 152 are provided. The hookup region BLHU (BLS/BLBIAS) is a region in which an element (circuit) and an interconnect coupled to a bit line BL are provided.

These regions are associated with each other so that one sense amplifier unit arrangement region SADL corresponds to one hookup region BLHU (BLS/BLBIAS).

Four hookup regions BLHU (BLS/BLBIAS) are provided as one unit within the region SEG.

Two sense amplifier unit arrangement regions SADL are adjacent in the X direction. Here, for convenience, a pair rs of two sense amplifier unit arrangement regions SADL adjacent in the X direction is referred to as a region set rs. A plurality of region sets rs are arranged in the Y direction.

Four hookup regions BLHU (BLS/BLBIAS) are provided between two region sets rs arranged in the Y direction. The four hookup regions BLHU (BLS/BLBIAS) correspond to the four sense amplifier unit arrangement regions SADL included in the two region sets rs, respectively.

Each of the bonding vias CBc is provided in the bonding via area ABb of the CMOS circuit chip 11 so as to correspond to an area r1 over one sense amplifier unit arrangement region SADL and two hookup regions BLHU (BLS/BLBIAS). The bonding via CBc is provided at a position overlapping the region r1 in the Z direction.

For example, in the bonding via CBc of the CMOS circuit chip 11 relating to the columns of the memory cell array 110, the bonding via CBc may be provided so as to overlap the sense amplifier unit arrangement region SADL in the Z direction. Further, the bonding via CBc may be provided at a position overlapping the hookup region BLHU (BLS/BLBIAS).

FIG. 15 is a schematic circuit diagram for explaining elements (circuits) provided in the hookup region BLHU (BLS/BLBIAS) in the memory device of the present embodiment.

As shown in FIG. 15, two field-effect transistors TRa and TRb are coupled to each NAND string NS via a bit line BL. The field-effect transistors TRa and TRb are, for example, high breakdown voltage transistors (high voltage transistors).

The field-effect transistor TRa is electrically coupled between the bit line BL and the sense amplifier unit 151. One end (one of the two source/drains) of a current path of the field-effect transistor TRa is coupled to the bit line BL. The other end (the other of the two source/drains) of the current path of the field-effect transistor TRa is coupled to the sense amplifier unit 151.

A control signal BLS is supplied to the gate of the field-effect transistor TRa. Activation (on and off) of the field-effect transistor TRa is controlled according to the control signal BLS.

The field-effect transistor TRa blocks a high voltage from being supplied to a transistor in the sense amplifier unit 151 (and the data latch circuit 152) when an erase voltage is applied to the memory cell MC in an erase sequence.

The field-effect transistor TRb is electrically coupled between the bit line BL and the driver circuit 160 (or the voltage generator 170). One end (one of the two source/drains) of a current path of the field-effect transistor TRb is coupled to the bit line BL. The other end (the other of the two source/drains) of the current path of the field-effect transistor TRb is coupled to the driver circuit 160. A control signal BLBIAS is supplied to the gate of the field-effect transistor TRb. Activation of the field-effect transistor TRb is controlled according to the control signal BLBIAS.

The field-effect transistor TRb applies a voltage (e.g., an erase voltage) from the driver circuit 160 to the bit line BL in the erase sequence.

FIG. 16 is a schematic plan view showing an example layout of elements in the sense amplifier unit arrangement region SADL and the hookup region BLHU (BLS/BLBIAS) of the CMOS circuit chip 11 in the memory device of the present embodiment.

As shown in FIG. 16, a plurality of field-effect transistors TRc are provided in the sense amplifier unit arrangement region SADL. The field-effect transistor TRc is, for example, a low breakdown voltage transistor (low voltage transistor).

One field-effect transistor TRc is provided on one active area AA2 in the semiconductor substrate 40. Two source/drain layers 67 and 68 of the field-effect transistor TRc are provided in the active area AA2. A gate electrode 66 of the field-effect transistor TRc is provided above the active area AA2 between the two source/drain layers 67 and 68 via a gate insulating layer (not shown).

Each of the sense amplifier unit 151, the data latch circuit 152, and the cache circuit 153 is formed by the field-effect transistor TRc.

A plurality of field-effect transistors TRa and TRb are provided in the hookup region BLHU (BLS/BLBIAS).

For example, two field-effect transistors TRa and two field-effect transistors TRb are provided on one active area AA1 in the semiconductor substrate 40. In this case, one active area AA1 spans two hookup regions BLHU (BLS/BLBIAS).

On the active area AA1, one field-effect transistor TRa is adjacent to one field-effect transistor TRb. The adjacent field-effect transistors TRa and TRb share one source/drain layer 62. The shared source/drain layer 62 is coupled to a bit line BL via bonding vias CBc and VBc.

The source/drain layers 61, 62, and 64 are provided in the active area AA1.

A gate electrode 60 of the field-effect transistor TRa is provided above the active area AA1 between two source/drain layers 61 and 62 via a gate insulating layer (not shown). The source/drain layer 61 is coupled to the sense amplifier unit 151.

A gate electrode 63 of the field-effect transistor TRb is provided above the active area AA1 between two source/drain layers 62 and 64 via a gate insulating layer (not shown). The source/drain layer 64 is coupled to the driver circuit 160.

On the active area AA1, two field-effect transistors TRb are adjacent to each other. The two adjacent field-effect transistors TRb share the source/drain layer 64.

The sharing of the source/drain layers 62 and 64 in the adjacent field-effect transistors TRa and TRb reduces a space to arrange a plurality of field-effect transistors TRa and TRb.

Thus, in the CMOS circuit chip 11, the components of the sense amplifier circuit 150 are laid out on the semiconductor substrate 40.

Figure 17:
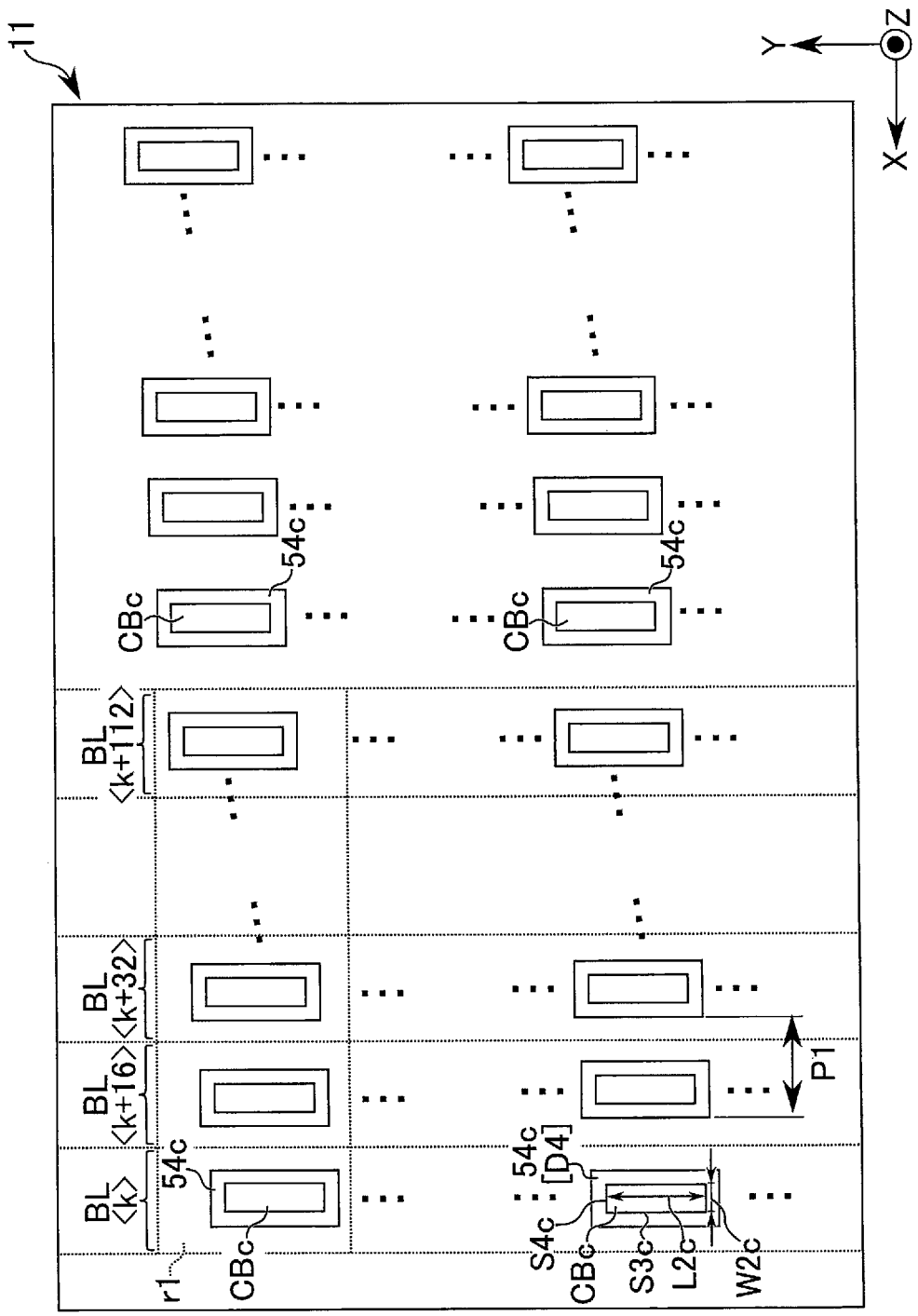
FIG. 17 is a top view showing an example of a layout of the memory device of the first embodiment.

FIG. 17 is a top view showing an example layout of the bonding vias CBc and various types of interconnects in the CMOS circuit chip 11 relating to the columns of the memory cell array 110 in the memory device 1 of the present embodiment.

As described above, the bonding via CBc is provided in the bonding via area ABb overlapping the sense amplifier area A2 in the Z direction. For example, the bonding via CBc is arranged above the region r1 including a corresponding sense amplifier unit arrangement region SADL in the sense amplifier area A2.

For example, eight bonding vias CBc, as a single unit, are arranged diagonally in the X-Y plane in the bonding via area ABb.

For example, eight bonding vias CBc arranged in the Y direction are arranged in eight areas r1 (e.g., the sense amp unit arrangement regions SADL) arranged in the X direction, respectively. The eight bonding vias CBc correspond, for example, to a k+1st bit line BL<k>, a k+17th bit line BL <k+16>, a k+33rd bit line BL <k+32>, a k+49th bit line BL <k+48>, a k+65th bit line BL<k+64>, a k+81st bit line BL <k+80>, a k+97th bit line BL <k+96>, and a k+113rd bit line BL <k+112>, respectively. Here, k is an integer of 0 or more.

In the CMOS circuit chip 11, the bonding vias CBc are electrically coupled to corresponding circuits (and elements) via a plurality of conductive layers 54c, conductive layers at lower layer interconnect levels, etc.

The bonding via CBc is provided on the conductive layer 54c as viewed from the bonding surface BF (BF2) side. The conductive layer 54c is provided in the interconnect level D4 that is further on the semiconductor substrate 40 side than the bonding surface BF. The conductive layer 54c is coupled to a conductive layer 52c via a via (not shown) and a conductive layer 53c. The conductive layer 54c has a rectangular planar shape as viewed from the Z direction. A dimension of the conductive layer 54c in the X direction is smaller than that of the conductive layer 54c in the Y direction.

Two conductive layers 54c adjacent in the X direction are arranged at the pitch P1. For example, two bonding vias CBc adjacent in the X direction are arranged at a certain pitch (e.g., the pitch P1).

The bonding via CBc is provided further on the bonding surface BF2 side than the interconnect level at which the conductive layer 54c is provided. An upper surface (a surface on the memory cell array chip 10 side) of the bonding via CBc is exposed from the bonding surface BF2. The bonding via CBc is joined to the above-described bonding via VBc so that the longitudinal directions of the bonding vias VBc and CBc intersect each other. This causes the two bonding vias VBc and CBc to overlap each other in a cross shape as viewed from the Z direction.

A side S3c of the bonding via CBc in the longitudinal direction is along the Y direction. A side S4c of the bonding via CBc in a width direction is along the X direction. A dimension W2c of the bonding via CBc in the X direction is smaller than a dimension L2c of the bonding via CBc in the Y direction. Hence, in a state where the bonding via CBc is joined to the bonding via VBc, the side S3c of the bonding via CBc in the longitudinal direction is substantially orthogonal to the side S1c of the bonding via VBc in the longitudinal direction along the bonding surface BF.

An area of the conductive layer 54c as viewed from the Z direction is set according to the dimensions of the bonding via CBc. For example, the area (dimensions in the X and Y directions) of the conductive layer 54c is larger than an area (dimensions in the X and Y directions) of the bonding via CBc.

As in the present embodiment, the dimension of the conductive layer 54c in the X direction can be reduced by reduction of the dimension W2c of the bonding member CBc through the use of the via. This allows a plurality of conductive layers 54c to be arranged along the X direction within the bonding via areas ABb of the CMOS circuit chip 11.

Example 2

Figure 18:
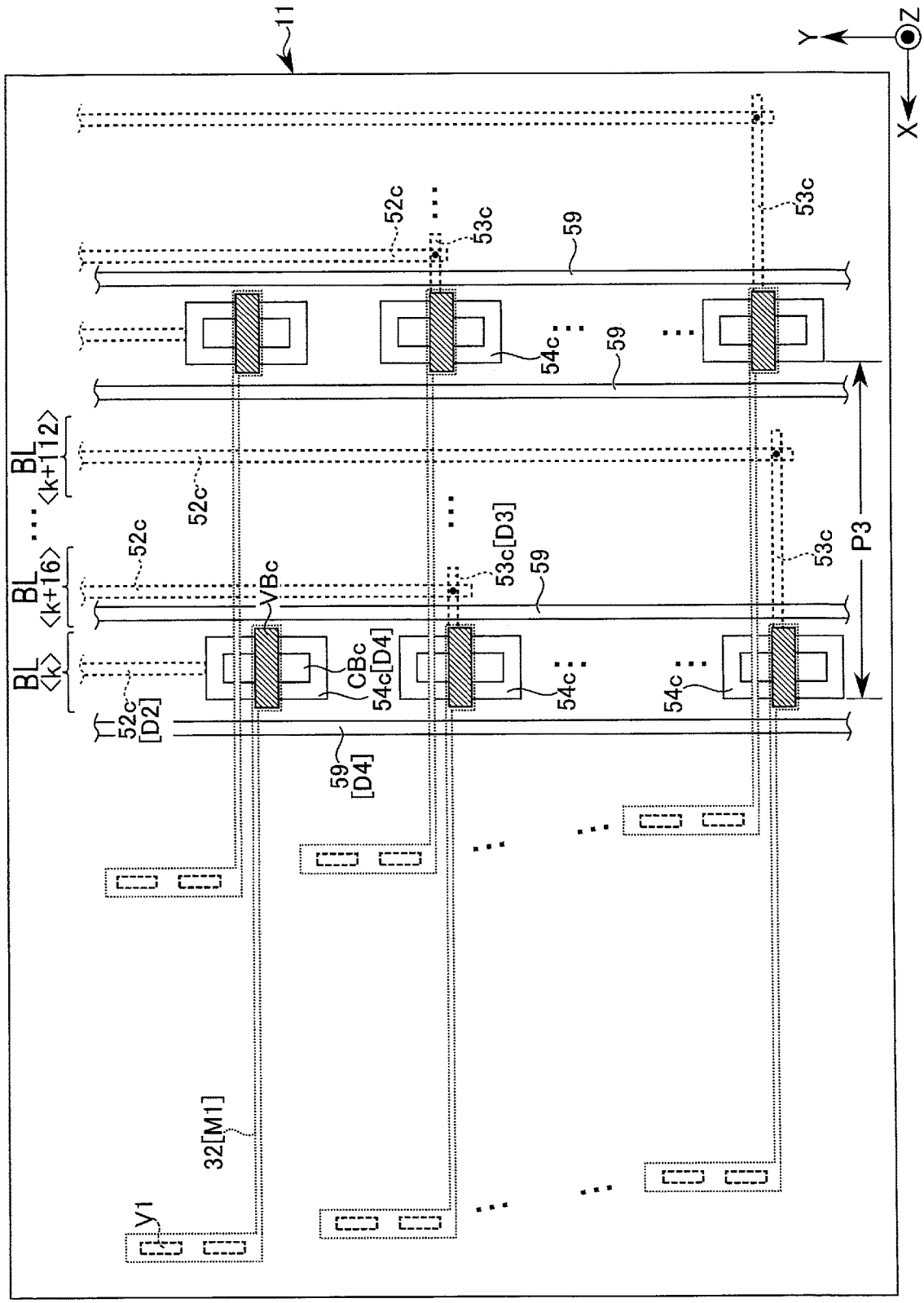
FIG. 18 is a top view showing an example of a layout of the memory device of the first embodiment.

FIG. 18 is a top view showing an example layout of the bonding vias VBc and CBc and various types of interconnects relating to the columns of the memory cell array 110 in the memory device 1 of the present embodiment.

FIG. 18 shows an example layout of the bonding vias VBc and CBc that differs from the examples in FIGS. 13 and 17.

In the example of FIG. 18, a plurality of (e.g., eight) bonding vias CBc are arranged on the same line in the Y direction.

In the CMOS circuit chip 11, the bonding vias CBc are electrically coupled to corresponding circuits (and elements) via a plurality of conductive layers 54c and a plurality of conductive layers 52c and 53c, etc.

The bonding via CBc is provided on the conductive layer 54c in the interconnect level D4 as viewed from the bonding surface BF (BF2) side. The conductive layer 54c is coupled to a conductive layer 52c via a via (not shown) and a conductive layer 53c. Similar to the above-described example, the conductive layer 54c has a rectangular planar shape as viewed from the Z direction. A dimension of the conductive layer 54c in the X direction is smaller than that of the conductive layer 54c in the Y direction.

For example, the conductive layer 53c includes a portion extending in the X direction. The conductive layer 53c is provided in the interconnect level D3 that is further on the semiconductor substrate 40 side than the conductive layer 54c.

The conductive layer 52c is coupled to the conductive layer 53c via a via (not shown). The conductive layer 52c extends in, for example, the Y direction. The conductive layer 52c is provided in the interconnect level D2 that is further on the semiconductor substrate 40 side than the conductive layer 53c.

For example, at a pitch P3 between two bonding vias CBc arranged in the X direction, a dimension is provided where eight conductive layers 52c can be arranged.

In the CMOS circuit chip 11, an interconnect 59 can be arranged in the same interconnect level D4 as the conductive layer 54c. For example, the interconnect 59 is adjacent to the conductive layer 54c. In the example of FIG. 18, only one interconnect 59 adjacent to each conductive layer 54c is illustrated, but a plurality of interconnects 59 may be arranged in a region near the conductive layers 54c.

As in the present embodiment, the dimension of the conductive layer 54c in the X direction can be reduced by reduction of the dimension W2c of the bonding member CBc through the use of the via. This expands a space between the two conductive layers 54c in the X direction. As a result, the number of interconnects (e.g., the interconnects 59) arranged in the space between the conductive layers 54c can be increased.

Alternatively, a pitch margin between adjacent interconnects in the space between the conductive layers 54c can be improved.

Alternatively, the chip size of the CMOS circuit chip 11 can be reduced by reduction of the conductive layers 54c.

As such, with respect to the columns of the memory cell array 110, an area is secured for interconnect routing within the CMOS circuit chip 11. As a result, inhibition of an interconnect passage within the bonding via areas AB is suppressed.

If the sides S1 and S3 in the longitudinal direction of two bonding vias VB (VBr or VBc) and CB (CBr or CBc) to be bonded intersect each other, the side of the bonding via VB in the longitudinal direction of the memory cell array chip 10 may be along the Y direction and the side of the bonding via CB in the longitudinal direction of the CMOS circuit chip 11 may be along the X direction.

The memory device 1 of the present embodiment is formed based on a well-known manufacturing method. Therefore, a description for a manufacturing method of the memory device 1 of the present embodiment is omitted. However, the formation of the bonding vias VB and CB and the bonding of the two semiconductor chips 10 and 11 are executed so that the two vias VB and CB are joined in a manner that the longitudinal direction of the bonding via VB of the memory cell array chip 10 intersects the longitudinal direction of the bonding via CB of the CMOS circuit chip 11.

The memory device 1 of the present embodiment can execute various operations based on well-known operations. Hence, a description for the various operations of the memory device 1 of the present embodiment is omitted.

(1d) Summary

The memory device 1 as a semiconductor device of the present embodiment uses the vias VB and CB as bonding members of the two semiconductor chips 10 and 11.

This reduces the number of members and/or steps to form the memory device 1 as compared to a case in which a conductive layer (pad) provided further on the bonding surface BF1 side than the via VB and a conductive layer provided further on the bonding surface BF2 side than the via CB are used as bonding members. As a result, the memory device 1 of the present embodiment can reduce manufacturing costs of the memory device 1.

Further, when the conductive layer as a bonding member is not provided between the vias VB and CB and the bonding surfaces BF1 and BF2 in the semiconductor chips 10 and 11, respectively, a Z-direction dimension (chip thickness) of the semiconductor chips 10 and 11 can be thinned. As a result, the memory device 1 of the present embodiment can contribute to a shrink of the dimension of the memory device in the Z direction.

In the present embodiment, each of the bonding vias VB and CB has a rectangular (line-shaped) planar shape as viewed from the Z direction (a direction perpendicular to the bonding surfaces BF1 and BF2).

This allows the areas of the conductive layers 32 and 54, which serve as bases for arranging the bonding vias VB and CB, to be reduced in the present embodiment. As a result, the memory device 1 of the present embodiment can suppress the conductive layers 32 and 54 from inhibiting the passage and arrangement of the plurality of interconnects within the bonding via areas AB. Alternatively, this allows the memory device 1 of the present embodiment to reduce the chip size (the area in the X-Y plane) of the semiconductor chips 10 and 11.

In the memory device 1 of the present embodiment, in a state where the two semiconductor chips 10 and 11 are bonded together, the two bonding vias VB and CB are joined together so that the longitudinal-direction side S1 of the bonding via VB intersects the longitudinal-direction side S3 of the bonding via CB. This ensures that the memory device 1 of the present embodiment has a margin for misalignment between the two semiconductor chips 10 and 11 when the semiconductor chips 10 and 11 are bonded together.

As described above, the semiconductor device 1 of the present embodiment can increase manufacturing efficiency of the semiconductor device.

(2) Second Embodiment

A memory device as a semiconductor device of a second embodiment will be described with reference to FIG. 19.

The memory device of the embodiment may be a flash memory other than a NAND flash memory.

For example, in the present embodiment, a memory device 700 is a NOR flash memory 700. The NOR flash memory 700 is a non-volatile semiconductor memory device capable of random access.

Figure 19:
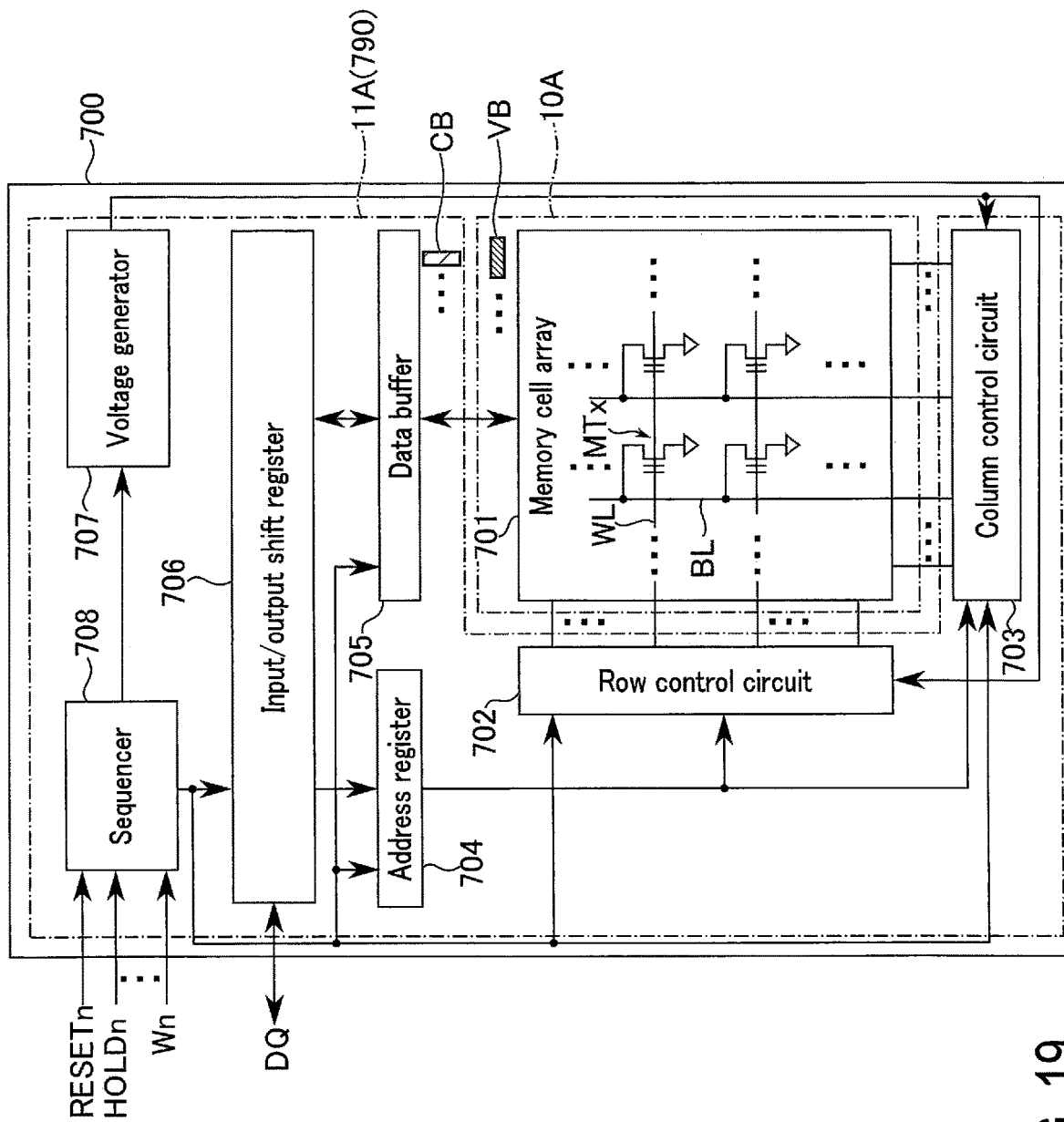
FIG. 19 is a block diagram showing a configuration example of a memory device of a second embodiment.

FIG. 19 is a block diagram showing an example of a circuit configuration of the NOR flash memory 700.

As shown in FIG. 19, the NOR flash memory 700 includes a memory cell array 701, a row control circuit 702, a column control circuit 703, an address register 704, a data buffer 705, an input/output shift register 706, a voltage generator 707, a sequencer 708, etc.

The memory cell array 701 includes a plurality of memory cells (memory cell transistors) MTx. In the NOR flash memory 700, the gate of each memory cell MTx is coupled to a corresponding one of a plurality of word lines WL. One end of a current path of each memory cell MTx is coupled to a corresponding one of a plurality of bit lines BL. The other end of the current path of each memory cell MTx is coupled to a source line, and is grounded, for example. The memory cells MTx are arranged in a two-dimensional array or a three-dimensional array.

The memory cell MTx is a field-effect transistor having a stacked gate structure including a charge storage layer. The charge storage layer may be a floating gate electrode or a charge trap film.

The row control circuit 702 selects a word line according to address information among the plurality of word lines WL. The row control circuit 702 applies a predetermined voltage to the selected word line (and a non-selected word line) according to a write sequence, a read sequence, an erase sequence, etc.

The column control circuit 703 selects a bit line according to address information among the plurality of bit lines BL. The column control circuit 703 applies a predetermined voltage to the selected bit line (and a non-selected bit line) according to a write sequence, a read sequence, an erase sequence, etc.

The address register 704 temporarily stores address information from the input/output shift register 706. The address register 704 transmits the address information to the row control circuit 702 and the column control circuit 703.

The data buffer 705 temporarily stores read data from the memory cell array 701 and write data from the input/output shift register 706.

The input/output shift register 706 temporarily stores data DQ that is transferred between the memory cell array 701 and the outside of the NOR flash memory 700. The data DQ may include read data, write data, and/or address information. The input/output shift register 706 transmits the address information to the address register 704. The input/output shift register 706 transmits the write data to the data buffer 705. The input/output shift register 706 transmits the read data supplied from the memory cell array 701 to the outside of the NOR flash memory 700. The input/output shift register 706 can perform parallel-to-serial conversion of the data DQ.

The voltage generator 707 generates a plurality of voltages used for each of a write sequence, a read sequence, and an erase operation. The voltage generator 707 supplies the generated voltages to the row control circuit 702, the column control circuit 703, etc.

The sequencer 708 controls the operations of the entire NOR flash memory 700 based on various control signals such as a reset signal RESETn, a hold signal HOLDn, a write protect signal Wn, etc.

The NOR flash memory 700 may include other components such as a status register. The status register temporarily stores a status signal indicating an internal operating status of the NOR flash memory 700 and an execution result of an operation sequence.

In the present embodiment, a set of the plurality of circuits 702 to 708 other than the memory cell array 701 of the NOR flash memory 700 is referred to as a CMOS circuit 790.

The NOR flash memory 700 as a memory device of the present embodiment has a bonded structure of two semiconductor chips 10A and 11A as shown in FIG. 3 described above.

The memory cell array 701 is provided in the semiconductor chip (memory cell array chip) 10A. The CMOS circuit 790 is provided in the semiconductor chip (CMOS circuit chip) 11A.

Similar to the semiconductor chips 10 and 11 of the memory device of the first embodiment, the memory cell array chip 10A includes a plurality of bonding vias VB coupled to bit lines BL and/or word lines WL, and the CMOS circuit chip 11A includes a plurality of bonding vias CB coupled to the circuit 790.

As described using FIG. 6, etc., the memory cell array chip 10A is bonded to the CMOS circuit chip 11A via the bonding vias VB and CB.

Therefore, the NOR flash memory 700 of the present embodiment can achieve substantially the same advantageous effect as that of the memory device of the first embodiment.

(3) Third Embodiment

A memory device as a semiconductor device of a third embodiment will be described with reference to FIG. 20.

The memory device of the embodiment may be a memory device other than a flash memory.

A memory device 800 of the present embodiment is a volatile semiconductor memory device. For example, the memory device 800 of the present embodiment is a DRAM.

Figure 20:
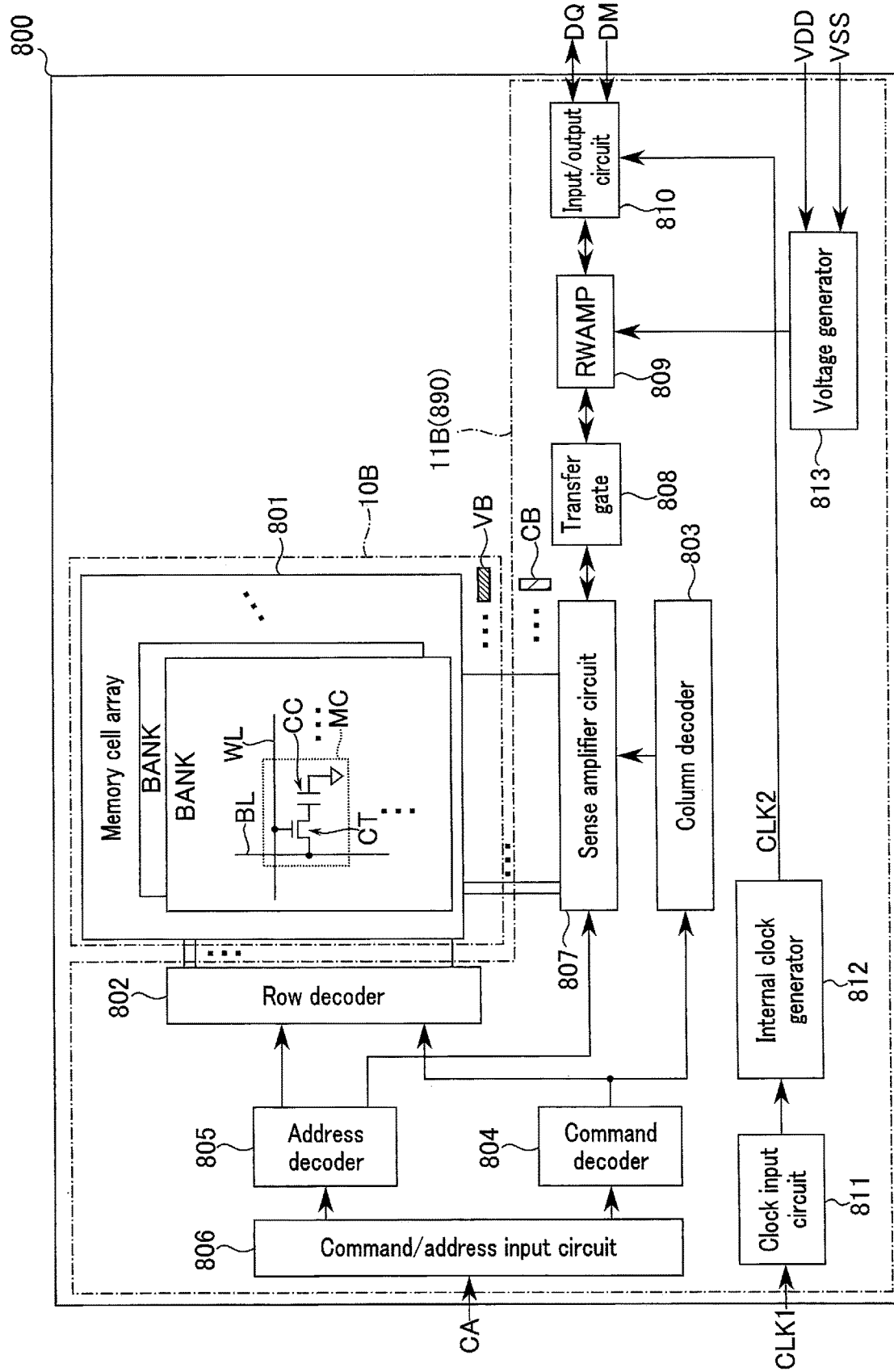
FIG. 20 is a block diagram showing a configuration example of a memory device of a third embodiment.

FIG. 20 is a block diagram showing an example of a circuit configuration of the DRAM as the memory device 800 of the present embodiment.

As shown in FIG. 20, the DRAM 800 includes a memory cell array 801, a row decoder 802, a column decoder 803, a command decoder 804, an address decoder 805, a command/address input circuit 806, a sense amplifier circuit 807, a transfer gate 808, a read/write amplifier circuit (RWAMP) 809, an input/output circuit 810, a clock input circuit 811, an internal clock generator 812, a voltage generator 813, etc.

The memory cell array 801 includes a plurality of memory cells MC. Each of the memory cells MC of the memory cell array 801 includes a cell capacitor CC and a cell transistor CT. The gate of the cell transistor CT is coupled to a corresponding one of a plurality of word lines WL. One end of a current path of the cell transistor CT is coupled to a bit line BL. The other end of the cell transistor CT is coupled to one end of the cell capacitor CC. The other end of the cell capacitor CC is grounded. The cell capacitor CC can store charges in an amount according to data to be stored. The cell transistor CT switches conduction/non-conduction (selection/non-selection of the memory cell) between the memory cell MC and the bit line BL. A plurality of memory cells MC are arranged in a two-dimensional or three-dimensional array in the memory cell array 801.

For example, the memory cell array 801 includes a plurality of banks. Each bank is a control unit including a plurality of memory cells. The banks are operable independently from each other.

The row decoder 802 controls selection/non-selection of a row (e.g., a word line) of the memory cell array 801 based on a decoding result of address information and a decoding result of a command.

The column decoder 803 controls selection/non-selection of a column (e.g., a bit line) of the memory cell array 801 based on a decoding result of address information and a decoding result of a command.

The column decoder 804 decodes a command from the command/address input circuit 806. The command decoder 804 sends a result of decoding the command to the row decoder 802 and the column decoder 803.

The address decoder 805 decodes address information from the command/address input circuit 806. The address decoder 805 sends a result of decoding the address information to the row decoder 802 and the column decoder 803.

The command/address input circuit 806 receives a command/address signal CA supplied from the outside. The command/address signal CA includes a command and address information. The command/address input circuit 806 sends a command to the command decoder 804. The command/address input circuit 806 sends address information to the address decoder 805.

The sense amplifier circuit 807 senses and amplifies a signal from a memory cell MC during a read sequence. The sense amplifier circuit 807 sends the signal from the memory cell MC as read data to the input/output circuit 810 via the transfer gate 808 and the read/write amplifier circuit 809. The sense amplifier circuit 807 receives write data from the input/output circuit 810 via the transfer gate 808 and the read/write amplifier circuit 809. The sense amplifier circuit 807 outputs a signal according to the write data to a bit line BL.

The transfer gate 808 controls data transfer between the sense amplifier circuit 807 and the read/write amplifier circuit 809.

The read/write amplifier circuit 809 amplifies a signal level (signal value) according to read data and a signal level according to write data.

The input/output circuit 810 functions as an interface circuit for data DQ transferred between the memory cell array 801 and the outside of the DRAM 800. The input/output circuit 810 sends write data to the memory cell array 801 at a timing synchronized with an internal clock CLK2. The input/output circuit 810 sends read data to a device outside the DRAM 800 at a timing synchronized with the internal clock CLK2. For example, the input/output circuit 810 receives a data mask signal DM. This causes the input/output circuit 810 to perform mask processing on the data DQ.

The clock input circuit 811 receives a clock (hereinafter referred to as an external clock) CLK1 from the outside. The clock input circuit 811 sends the external clock CLK1 to the internal clock generator 812.

The internal clock generator 812 generates the internal clock CLK2 based on the external clock CLK1. The internal clock generator 812 sends the generated internal clock CLK2 to the input/output circuit 810, etc.

The voltage generator 813 generates a plurality of voltages respectively used for various operation sequences of the DRAM 800 by using power supply voltages VDD and VSS from the outside. The voltage generator 813 sends the generated voltages to other circuits (e.g., the read/write amplifier circuit 809).

In the present embodiment, a set of the plurality of circuits 802 to 813 other than the memory cell array 801 of the DRAM 800 will be referred to as a CMOS circuit 890.

The DRAM 800 as a memory device of the present embodiment has a bonded structure of two semiconductor chips 10B and 11B.

The memory cell array 801 is provided within the semiconductor chip (memory cell array chip) 10B. The CMOS circuit 890 is provided in the semiconductor chip (CMOS circuit chip) 11B.

Similar to the semiconductor chips 10 and 11 of the memory device of the first embodiment, the memory cell array chip 10B includes a plurality of bonding vias VB coupled to bit lines BL and/or word lines WL, and the CMOS circuit chip 11B includes a plurality of bonding vias CB coupled to the circuit 890.

As described by using the above-described FIGS. 3 and 6, etc., the memory cell array chip 10B is bonded to the CMOS circuit chip 11B via the bonding vias VB and CB.

Therefore, the DRAM 800 of the present embodiment can achieve substantially the same advantageous effect as that of the memory device of the first embodiment.

The present embodiment shows the case in which the memory device 800 is a DRAM. However, the memory device may be any random access memory other than the DRAM. For example, the memory device 800 may be a static RAM (SRAM). Further, the memory device 800 may be a memory device whose memory element is a transition metal oxide element having variable resistive characteristics (e.g., a resistance-change memory such as a resistive random access memory (ReRAM)), a memory device whose memory element is a phase-change element (e.g., a phase-change memory such as a phase change random access memory (PCRAM)), or a memory device whose memory element is a ferroelectric element (e.g., a ferroelectric memory such as a ferroelectric random access memory (FeRAM)).

(4) Fourth Embodiment

A semiconductor device of a fourth embodiment will be described with reference to FIG. 21.

A device having the bonded structure of the above-described embodiments may be a semiconductor device other than the memory device.

For example, in the present embodiment, a semiconductor device 900 is an image sensor 900.

Figure 21:
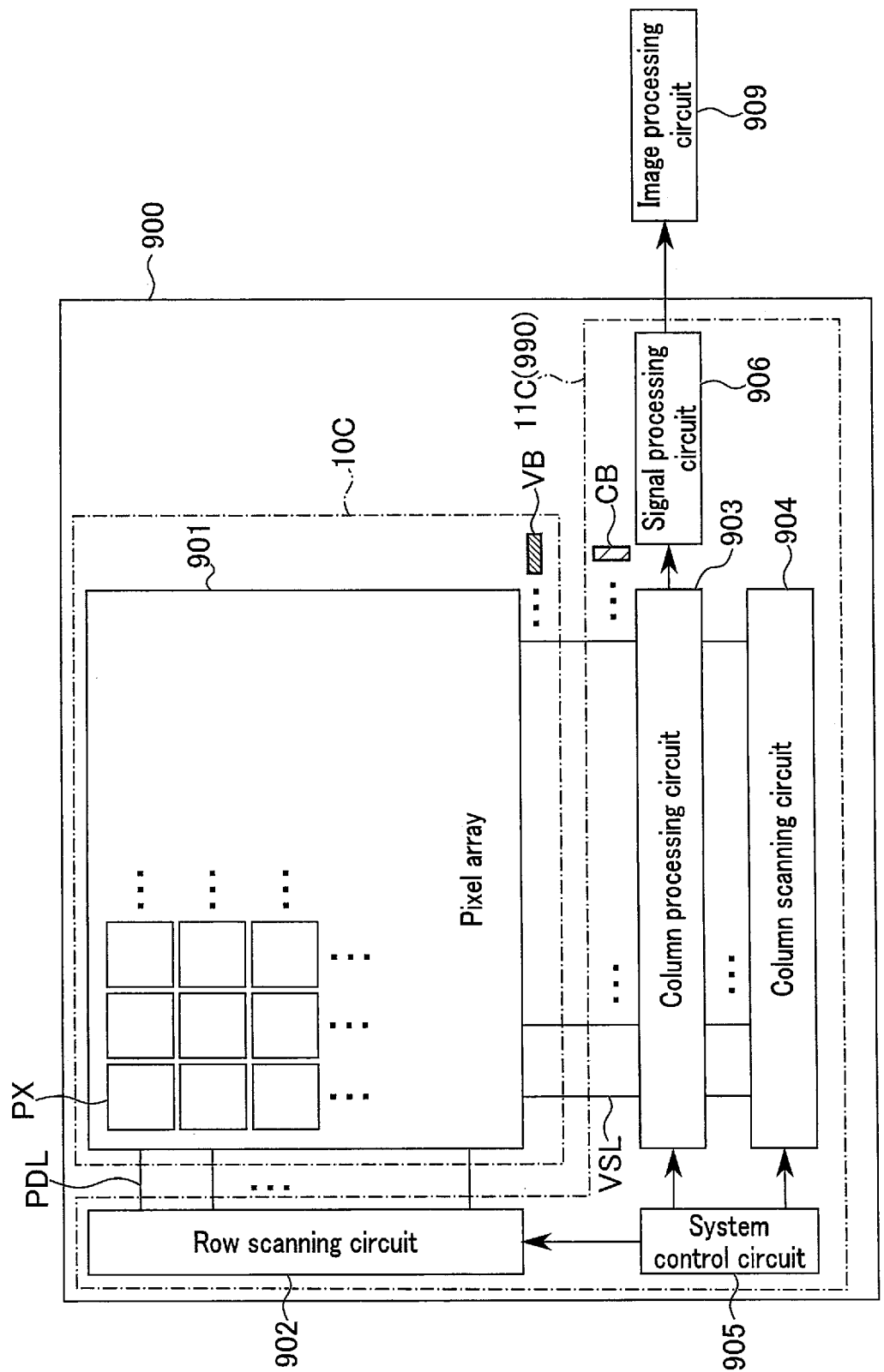
FIG. 21 is a block diagram showing a configuration example of a semiconductor device of a fourth embodiment.

FIG. 21 is a block diagram showing an example of a circuit configuration of the image sensor as the semiconductor device 900 of the present embodiment.

As shown in FIG. 21, the image sensor 900 includes a pixel array 901, a row scanning circuit 902, a column processing circuit 903, a column scanning circuit 904, a system control circuit 905, and a signal processing circuit 906.

The pixel array 901 includes a plurality of pixels PX. The pixels PX are arranged in a two-dimensional grid shape along a row direction (X direction) and a column direction (Y direction). Each pixel PX has a photoelectric conversion element. The photoelectric conversion element generates a charge in response to an amount of light received and stores the generated charge. For a light incident surface of each pixel PX, a filter may be provided in the pixel array 901. For example, an arrangement pattern of a plurality of filters is, for example, a Bayer pattern.

In the pixel array 901, a plurality of pixels PX arranged in the row direction are commonly coupled to a pixel drive line PDL. In the pixel array 901, a plurality of pixels PX arranged in the column direction are commonly coupled to a corresponding one of a plurality of vertical signal lines VSL.

The row scanning circuit 902 is coupled to one ends of a plurality of pixel drive lines PDL. The row scanning circuit 902 generates a drive signal for driving a signal readout from a pixel PX. The row scanning circuit 902 drives all the pixels PX in the pixel array 901 simultaneously or row by row, etc., via the pixel drive lines PDL.

Signals output from the pixels PX driven by the row scanning circuit 902 are supplied to the column processing circuit 903 for each set of pixels PX arranged in the row direction via each of the vertical signal lines VSL. The column processing circuit 903 performs predetermined signal processing on the signals supplied via the vertical signal lines VSL. The column processing circuit 903 thereby generates a pixel signal. The column processing circuit 903 can temporarily store the generated pixel signal. For example, the column processing circuit 903 performs noise cancellation processing and analog-to-digital conversion (AD conversion) processing. A digital signal obtained through the AD conversion is output to the signal processing circuit 906.

The column scanning circuit 904 selects a readout circuit corresponding to an array of pixel signals in the column processing circuit 903 in sequence. Through selective scanning by the column scanning circuit 904, the pixel signals processed for each pixel in the column processing circuit 903 are output based on a predetermined order.

The system control circuit 905 receives a system clock signal, etc. via a controller (not shown) outside the image sensor 900. The system control circuit 905 includes a timing generator, etc. The timing generator generates various timing signals based on the system clock signal. The system control circuit 905 thereby drives the row scanning circuit 902, the column processing circuit 903, and the column scanning circuit 904, etc., based on the various timing signals generated.

The signal processing circuit 906 has at least an arithmetic processing function. The signal processing circuit 906 performs various signal processing such as arithmetic processing on the pixel signals output from the column processing circuit 903.

A digital signal output from the signal processing circuit 906 is output to an image processing circuit 909 outside the image sensor 900. The image processing circuit 909 performs predetermined processing on the digital signal. This generates an image signal for displaying an image on a predetermined display device.

In the present embodiment, a set of the plurality of circuits 902 to 906 other than the pixel array 901 of the image sensor 900 is referred to as a CMOS circuit 990.

The image sensor 900 as a semiconductor device of the present embodiment has a bonded structure of two semiconductor chips 10C and 11C.

The pixel array 901 is provided in the semiconductor chip (hereinafter also referred to as a pixel array chip) 10C. The CMOS circuit 990 is provided in the semiconductor chip (CMOS circuit chip) 11C.

Similar to the semiconductor chips 10 and 11 of the memory device of the first embodiment, the pixel array chip 10C includes a plurality of bonding vias VB, and the CMOS circuit chip 11C includes a plurality of bonding vias CB. For example, the bonding vias VB are coupled to the pixel drive lines PDL and/or the vertical signal lines VSL. For example, the bonding vias CB are coupled to the circuit 990.

As described using FIGS. 3 and 6 described above, etc., the pixel array chip 10C is bonded to the CMOS circuit chip 11C via the bonding vias VB and CB.

Therefore, the image sensor 900 of the present embodiment can achieve substantially the same advantageous effect as that of the memory device of the above-described embodiments.

(5) Fifth Embodiment

A memory device (or semiconductor device) of a fifth embodiment will be described with reference to FIG. 22.

Figure 22:
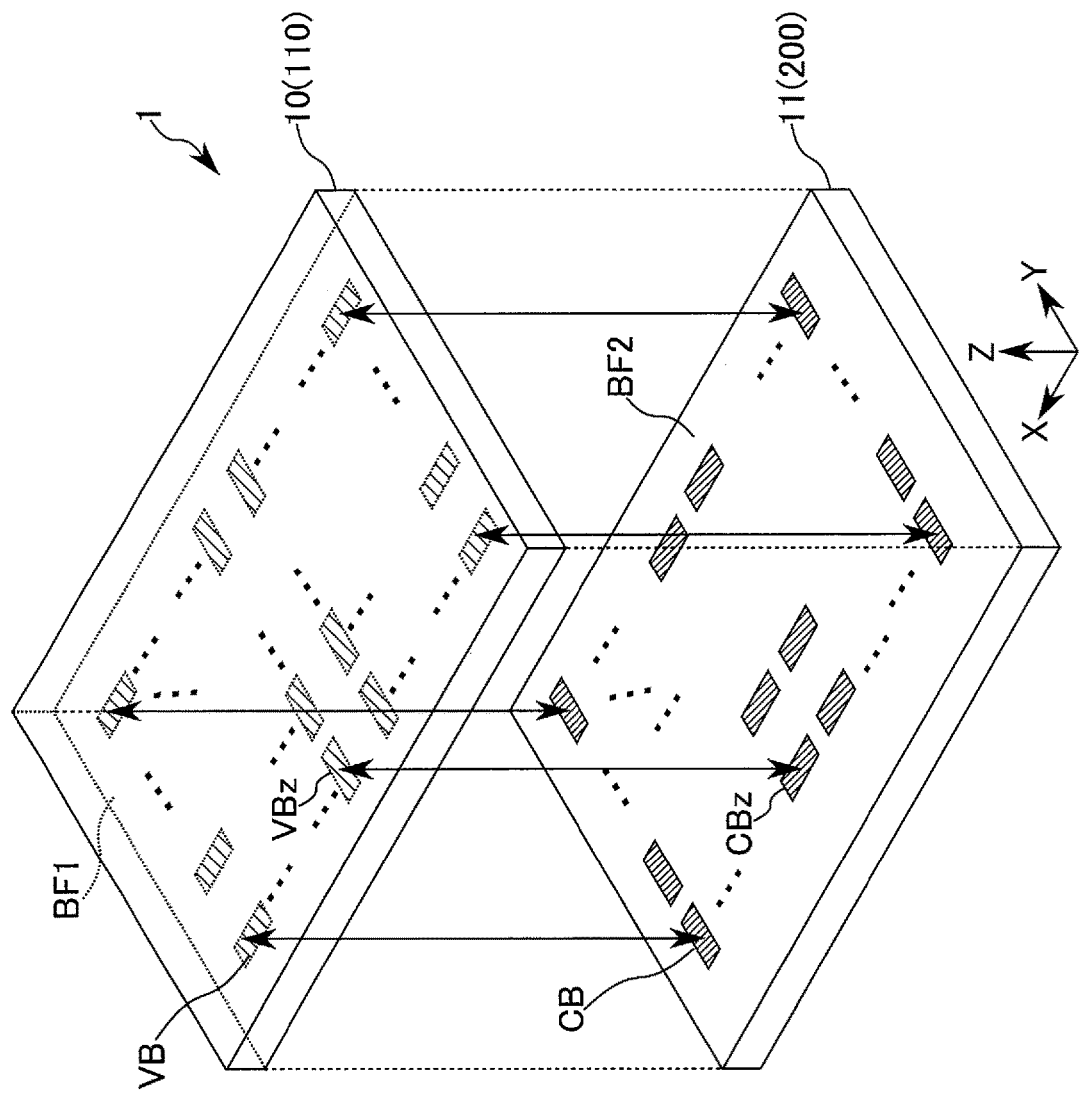
FIG. 22 is a schematic diagram showing a configuration example of a semiconductor device of a fifth embodiment.

FIG. 22 is a schematic diagram for explaining a configuration example of the memory device of the present embodiment.

As shown in FIG. 22, the memory cell array chip 10 may include a bonding via VB having a rectangular shape whose longitudinal direction is along the X direction and a bonding via VBz having a rectangular shape whose longitudinal direction is along the Y direction.

Further, the CMOS circuit chip 11 may include a bonding via CB having a rectangular shape whose longitudinal direction is along the Y direction, and a bonding via CBz having a rectangular shape whose longitudinal direction is along the X direction.

In this case, the bonding via VB is joined to the bonding via CB as described above.

The bonding via VBz is joined to the bonding via CBz.

Thus, even when each of the chips 10 and 11 includes the bonding vias VB, VBz, CB, and CBz with different longitudinal orientations, the memory device of the present embodiment can achieve substantially the same effect as that of the above-described embodiments.

For example, when the configuration of the semiconductor device of the fifth embodiment is applied to the image sensor of the fourth embodiment, the bonding vias VB and CB may be coupled to the pixel drive lines PDL and the bonding vias VBz and CBz may be coupled to the vertical signal lines VSL.

(6) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor chip including an element and a first via provided in a first surface; and
a second semiconductor chip including a second via provided in a second surface and a circuit electrically coupled to the element through the first and second vias, and overlapping the first semiconductor chip in a first direction perpendicular to the first and second surfaces,
wherein
the first via includes a first side along a second direction parallel to the first surface, and a second side along a third direction parallel to the first surface and intersecting the second direction,
the second via includes a third side along the third direction and a fourth side along the second direction,
a dimension of the first side in the second direction is larger than a dimension of the second side in the third direction,
a dimension of the third side in the third direction is larger than a dimension of the fourth side in the second direction, and
the first via is in contact with the second via so that the first side intersects the third side.

2. The semiconductor device according to claim 1, wherein
the first and second vias overlap each other in a cross shape as viewed from the first direction.

3. The semiconductor device according to claim 1, wherein
the first semiconductor chip includes an element area in which the element is provided and a hookup area in which a plurality of interconnects in the element area are hooked up, the hookup area being adjacent to the element area,
the second semiconductor chip includes a circuit area in which the circuit is provided,
the first via is provided in the hookup area, and
the second via is provided in the circuit area.

4. The semiconductor device according to claim 1, wherein
the first semiconductor chip includes:

a first interconnect coupled to the element, extending in the third direction, and provided in a first interconnect level; and a second interconnect coupled to the first interconnect and the first via, extending in the second direction, and provided in a second interconnect level between the first interconnect level and the first surface.

5. The semiconductor device according to claim 4, wherein
the second semiconductor chip includes a third interconnect coupled to the second interconnect through the second via and extending in the third direction.

6. The semiconductor device according to claim 1, wherein
the first semiconductor chip includes a first conductive layer,
the second semiconductor chip includes a second conductive layer,
the first via is provided between the first conductive layer and the second via,
the second via is provided between the second conductive layer and the first via,
the first conductive layer includes a fifth side along the second direction and a sixth side along the third direction,
the second conductive layer includes a seventh side along the third direction and an eighth side along the second direction,
a dimension of the fifth side in the second direction is larger than a dimension of the sixth side in the third direction, and
a dimension of the seventh side in the third direction is larger than a dimension of the eighth side in the second direction.

7. The semiconductor device according to claim 6, wherein
the first semiconductor chip includes a plurality of fourth interconnects adjacent to the first conductive layer in a direction parallel to the first surface, and
the second semiconductor chip includes a plurality of fifth interconnects adjacent to the second conductive layer in a direction parallel to the second surface.

8. The semiconductor device according to claim 6, wherein
the first semiconductor chip includes a fourth interconnect adjacent to the first conductive layer in a direction parallel to the first surface.

9. The semiconductor device according to claim 8, wherein
the fifth side of the first conductive layer is along an extending direction of the fourth interconnect.

10. The semiconductor device according to claim 6, wherein
the second semiconductor chip includes a plurality of fifth interconnects adjacent to the second conductive layer in a direction parallel to the second surface.

11. The semiconductor device according to claim 10, wherein
the seventh side of the second conductive layer is along an extending direction of the fifth interconnects.

12. The semiconductor device according to claim 6, wherein
the first semiconductor chip further includes a third conductive layer with a configuration same as a configuration of the first conductive layer, the second semiconductor chip further includes a fourth conductive layer with a configuration same as a configuration of the second conductive layer, and a first pitch between the first conductive layer and the third conductive layer is equal to a second pitch between the second conductive layer and the fourth conductive layer.

13. The semiconductor device according to claim 1, wherein
the first semiconductor chip further includes a third via,
the second semiconductor chip further includes a fourth via,
the third via includes a ninth side along the second direction and a tenth side along the third direction,
the fourth via includes an eleventh side along the third direction and a twelfth side along the second direction,
a dimension of the ninth side in the second direction is smaller than a dimension of the tenth side in the third direction,
a dimension of the eleventh side in the third direction is smaller than a dimension of the twelfth side in the second direction, and
the third via is in contact with the fourth via so that the ninth side intersects the eleventh side.

14. The semiconductor device according to claim 1, wherein
the circuit includes a sense amplifier circuit including a plurality of transistors and a high voltage transistor coupled to an interconnect that couples the element and the sense amplifier circuit, and
the second via overlaps a region in which the sense amplifier circuit or the high voltage transistor is provided in the first direction.

15. The semiconductor device according to claim 1, wherein
the first and second vias include copper.

16. The semiconductor device according to claim 1, wherein
the first and second vias include a barrier metal containing any one of a titanium nitride, a tantalum nitride, and a layer stack of a tantalum nitride and tantalum.

17. The semiconductor device according to claim 1, wherein
the element is provided in a memory cell array of a memory device, and
the circuit controls an operation of the memory cell array.

18. The semiconductor device according to claim 17, wherein
the memory device is a flash memory or a random access memory.

19. The semiconductor device according to claim 1, wherein
the first semiconductor chip includes:
a layer stack including a plurality of fifth conductive layers stacked in the first direction; and
a memory pillar provided in the layer stack and extending in the first direction.

20. The semiconductor device according to claim 1, wherein
the element is provided in a pixel array of an image sensor, and
the circuit controls an operation of the pixel array.

* * * * *